(12) United States Patent
Lee et al.

(10) Patent No.: US 11,637,979 B2
(45) Date of Patent: Apr. 25, 2023

(54) IMAGE SENSOR USING A BOOSTING CAPACITOR AND A NEGATIVE BIAS VOLTAGE

(71) Applicant: SAMSUNG ELECTRONICS CO., LTD., Suwon-si (KR)

(72) Inventors: Kyungho Lee, Suwon-si (KR); Eunsub Shim, Hwaseong-si (KR); Jungbin Yun, Hwaseong-si (KR); Sungsoo Choi, Hwaseong-si (KR); Masato Fujita, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 179 days.

(21) Appl. No.: 16/801,887

(22) Filed: Feb. 26, 2020

(65) Prior Publication Data
US 2021/0029316 A1  Jan. 28, 2021

(30) Foreign Application Priority Data
Jul. 24, 2019  (KR) .......................... 10-2019-0089435

(51) Int. Cl.
*H04N 5/369* (2011.01)
*H01L 23/00* (2006.01)
(Continued)

(52) U.S. Cl.
CPC ........... *H04N 5/3698* (2013.01); *H01L 24/08* (2013.01); *H01L 27/14609* (2013.01);
(Continued)

(58) Field of Classification Search
CPC ...... H04N 5/374; H04N 5/343; H04N 5/3698; H04N 5/37452; H04N 5/379; H04N 5/232;
(Continued)

(56) References Cited

U.S. PATENT DOCUMENTS 7,476,837 B2  1/2009 Koyama
8,189,082 B2 *  5/2012 Matsuura ............. H04N 5/3559
348/294

(Continued)

FOREIGN PATENT DOCUMENTS

JP  2006-217338  8/2006
KR  10-2011-0018104  2/2011
KR  10-2016-0121996  10/2016

*Primary Examiner* — Albert H Cutler
(74) *Attorney, Agent, or Firm* — F. Chau & Associates, LLC

(57) ABSTRACT

An image sensor includes a photodiode generating a charge in response to light, a transfer transistor connecting the photodiode and a floating diffusion, a reset transistor connected between the floating diffusion and a power node, a boosting capacitor connected to the floating diffusion, and adjusting a capacity of the floating diffusion in response to a boosting control signal, and a bias circuit having first and second current circuits for supplying different bias currents to an output node to which a voltage signal corresponding to a charge accumulated in the floating diffusion is output. The boosting control signal decreases from a high level to a low level after the transfer transistor is turned off, and the reset transistor is switched from a turned on state to a turned off state when the bias currents of the first and second current circuits are simultaneously provided to the output node.

10 Claims, 20 Drawing Sheets

(51) Int. Cl.
  *H01L 27/146* (2006.01)
  *H04N 5/341* (2011.01)
  *H04N 5/351* (2011.01)
  *H04N 5/3745* (2011.01)
  *H04N 5/378* (2011.01)
  *H04N 5/374* (2011.01)
  *H04N 5/376* (2011.01)

(52) U.S. Cl.
  CPC .. *H01L 27/14612* (2013.01); *H01L 27/14634* (2013.01); *H01L 27/14636* (2013.01); *H04N 5/341* (2013.01); *H04N 5/351* (2013.01); *H04N 5/378* (2013.01); *H04N 5/379* (2018.08); *H04N 5/3745* (2013.01); *H01L 24/06* (2013.01); *H01L 2224/06135* (2013.01); *H01L 2224/08145* (2013.01); *H01L 2924/12043* (2013.01); *H01L 2924/1431* (2013.01); *H01L 2924/1434* (2013.01)

(58) Field of Classification Search
  CPC .. H04N 5/3559; H04N 5/3741; H04N 5/3765; H04N 5/341; H04N 5/351; H04N 5/3745; H04N 5/378; H01L 27/14643; H01L 27/14601; H01L 27/14605; H01L 24/08; H01L 27/14609; H01L 27/14612; H01L 27/14634; H01L 27/14636; H01L 24/06; H01L 2224/06135; H01L 2224/08145; H01L 2924/12043; H01L 2924/1431; H01L 2924/1434; H01L 24/16; H01L 2224/16145; G03B 17/02; G03B 17/18; G03B 17/56

See application file for complete search history.

(56) References Cited

U.S. PATENT DOCUMENTS

| | | | |
|---|---|---|---|
| 8,373,694 | B2 | 2/2013 | Kimura et al. |
| 8,563,914 | B2 | 10/2013 | Ahn et al. |
| 8,969,819 | B2 | 3/2015 | Tanaka et al. |
| 9,344,658 | B2 | 5/2016 | Dai et al. |
| 9,881,968 | B2 | 1/2018 | Storm et al. |
| 9,967,504 | B1 | 5/2018 | Manabe et al. |
| 10,110,783 | B2 | 10/2018 | Webster |
| 2011/0036969 | A1 | 2/2011 | Ahn et al. |
| 2013/0001403 | A1* | 1/2013 | Yamakawa ....... H01L 27/14609 250/208.1 |
| 2015/0041865 | A1* | 2/2015 | Storm ............... H01L 27/14812 257/229 |
| 2015/0281684 | A1* | 10/2015 | Beck ................... H04N 17/045 348/175 |
| 2016/0300873 | A1 | 10/2016 | Kim et al. |
| 2016/0307949 | A1* | 10/2016 | Madurawe ............ H04N 5/353 |
| 2018/0247969 | A1 | 8/2018 | Mori et al. |
| 2021/0176458 | A1* | 6/2021 | Inada ................ H01L 27/14645 |

* cited by examiner

IMAGE SENSOR USING A BOOSTING CAPACITOR AND A NEGATIVE BIAS VOLTAGE

CROSS-REFERENCE TO RELATED APPLICATION

This application claims priority under 35 U.S.C. § 119 to Korean Patent Application No. 10-2019-0089435, filed on Jul. 24, 2019 in the Korean Intellectual Property Office, the disclosure of which is incorporated by reference herein in its entirety.

TECHNICAL FIELD

Exemplary embodiments of the present inventive concept relate to an image sensor using a boosting capacitor and a negative bias voltage.

DISCUSSION OF RELATED ART

An image sensor is a semiconductor-based sensor that receives light to generate an electrical signal, and may include a pixel array having a plurality of pixels, logic circuits for driving the pixel array and generating an image, and the like. The plurality of pixels may include a photodiode generating a charge in response to external light, a pixel circuit converting the charge generated by the photodiode into an electrical signal, and the like. The image sensor may be widely applied to smartphones, tablet personal computers (PCs), laptop computers, televisions, vehicles, or the like, in addition to cameras for taking a picture or a video. Recently, as image sensors have become smaller, various methods for increasing power efficiency have been proposed.

SUMMARY According to an exemplary embodiment of the present inventive concept, an image sensor includes a photodiode configured to generate a charge in response to light, a transfer transistor connecting the photodiode and a floating diffusion in response to a transmission control signal, a reset transistor connected between the floating diffusion and a power node, a boosting capacitor connected to the floating diffusion, and configured to adjust capacity of the floating diffusion in response to a boosting control signal, and a bias circuit having a first current circuit and a second current circuit configured to supply different bias currents to an output node to which a voltage signal corresponding to a charge accumulated in the floating diffusion is output. The boosting control signal decreases from a high level to a low level after the transfer transistor is turned off, and the reset transistor is switched from a turned-on state to a turned-off state during a first time at which a first bias current of the first current circuit and a second bias current of the second current circuit are simultaneously provided to the output node.

According to an exemplary embodiment of the present inventive concept, an image sensor includes a photodiode configured to generate a charge in response to light, a transfer transistor connecting the photodiode and a floating diffusion in response to a transmission control signal, a reset transistor connected between the floating diffusion and a power node, and a boosting capacitor connected to the floating diffusion, and configured to adjust a capacity of the floating diffusion in response to a boosting control signal. The boosting control signal increases from a low level to a high level before the transfer transistor is turned on, and decreases from a high level to a low level after the transfer transistor is turned off.

According to an exemplary embodiment of the present inventive concept, an image sensor includes a first semiconductor chip including a photodiode configured to generate a charge in response to light, a reset transistor connected between a floating diffusion and a power supply node, a transfer transistor configured to transfer the charge generated by the photodiode to the floating diffusion, a bias voltage supply terminal configured to supply a bias voltage to the photodiode and the floating diffusion, and an output node configured to output a voltage signal corresponding to a charge accumulated in the floating diffusion, and a second semiconductor chip connected to the output node through a metal pad, and including a first current circuit configured to output a first bias current. The bias voltage is a negative voltage with respect to a ground voltage of the second semiconductor chip.

BRIEF DESCRIPTION OF DRAWINGS

The above and other aspects and features of the present inventive concept will be more clearly understood by describing in detail exemplary embodiments thereof with reference to the accompanying drawings.

DETAILED DESCRIPTION OF THE EMBODIMENTS

Figure 1:
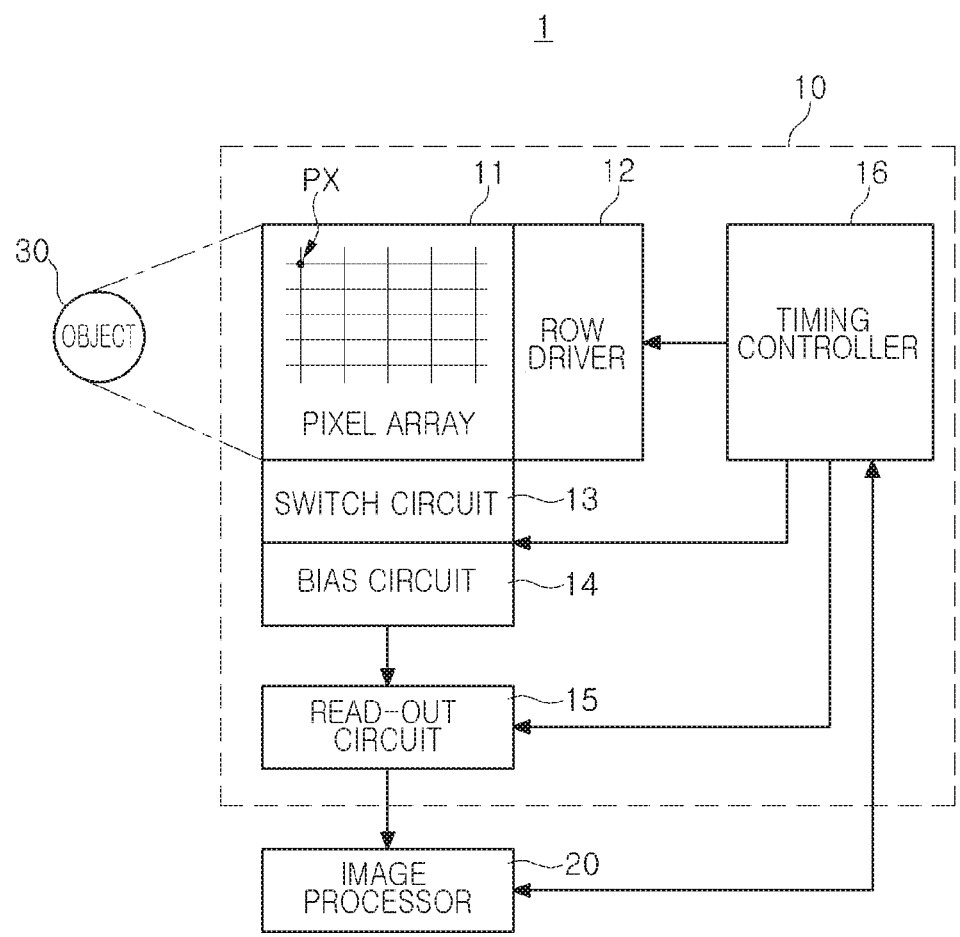
FIG. 1 is a view schematically illustrating an image processing apparatus including an image sensor according to an exemplary embodiment of the present inventive concept.

Exemplary embodiments of the present inventive concept relate to an image sensor that can reduce a power supply voltage applied to a pixel, and shorten a settling time for stabilizing voltages of column lines connected to the pixel.

Hereinafter, exemplary embodiments of the present inventive concept will be described with reference to the accompanying drawings. Like reference numerals may refer to like elements throughout this application FIG. 1 is a view schematically illustrating an image processing apparatus including an image sensor according to an exemplary embodiment of the present inventive concept.

Referring to FIG. 1, an image processing apparatus 1 according to an exemplary embodiment of the present inventive concept may include an image sensor 10 and an image processor 20. The image sensor 10 may include a pixel array 11, a row driver 12, a switch circuit 13, a bias circuit 14, a read-out circuit 15, a timing controller 16, and the like. The row driver 12, the switch circuit 13, the bias circuit 14, the read-out circuit 15, and the timing controller 16 may be circuits for generating image data for controlling the pixel array 11, and may be included in a control logic.

The image sensor 10 may operate according to a control command received from the image processor 20, and may convert light transmitted from an object 30 into an electrical signal and output the converted signal to the image processor 20. The pixel array 11 included in the image sensor 10 may include a plurality of pixels PX, and the plurality of pixels PX may each include a photoelectric device receiving light to generate a charge, for example, a photo diode (PD). In an exemplary embodiment of the present inventive concept, each of the plurality of pixels PX may include two or more photoelectric devices. Two or more photoelectric devices may be included in each of the plurality of pixels PX for the purpose of generating a pixel signal corresponding to light of various colors, or providing an autofocusing function.

Meanwhile, each of the plurality of pixels PX may include a pixel circuit for generating a pixel signal from charges generated by photodiodes. In an exemplary embodiment of the present inventive concept, the pixel circuit may include a transfer transistor, a driving transistor, a selection transistor, a reset transistor, and the like. The pixel circuit may obtain a pixel signal by detecting a reset voltage and a pixel voltage from each of the plurality of pixels PX, and by calculating the difference between the reset voltage and the pixel voltage. The pixel voltage may be a voltage in which charges generated in photodiodes included in each of the plurality of pixels PX are reflected. In an exemplary embodiment of the present inventive concept, two or more pixels PX adjacent to each other may constitute one pixel group, and two or more pixels PX included in the pixel group may share at least a portion of the transfer transistor, the driving transistor, the selection transistor, and the reset transistor with each other.

The row driver 12 may drive the pixel array 11 in units of rows. For example, the row driver 12 may generate a transmission control signal for controlling the transfer transistor of the pixel circuit, a reset control signal for controlling the reset transistor, a selection control signal for controlling the selection transistor, and the like.

The read-out circuit 15 may include a correlated double sampler (CDS), an analog-to digital converter (ADC), and the like. The correlated double sampler may be connected to the pixels PX, included in a row line selected by a row selection signal supplied by the row driver 12, through column lines, and may perform correlated double sampling to detect the reset voltage and the pixel voltage. The analog-to-digital converter may convert the reset voltage and the pixel voltage detected by the correlated double sampler into a digital signal and output the digital signal.

The bias circuit 14 may input a predetermined bias current to the column lines connected to the pixels PX while the read-out circuit 15 detects the reset voltage and the pixel voltage from the pixels PX. The bias circuit 14 may include a plurality of current circuits corresponding to the column lines. The switch circuit 13 may set a connection path of the plurality of current circuits and the column lines.

An operation of the row driver 12, the switch circuit 13, the bias circuit 14, and the read-out circuit 15 may be determined by the timing controller 16, and the timing controller 16 may operate by a control command transmitted by the image processor 20. The image processor 20 may process image data output by the read-out circuit 15 and output the image data to a display device or the like, or store the image data in a storage device such as a memory or the like. Alternatively, when the image processing apparatus 1 is mounted on an autonomous vehicle, the image processor 20 may process the image data and transmit the image data to a main controller for controlling the autonomous vehicle.

Figure 2:
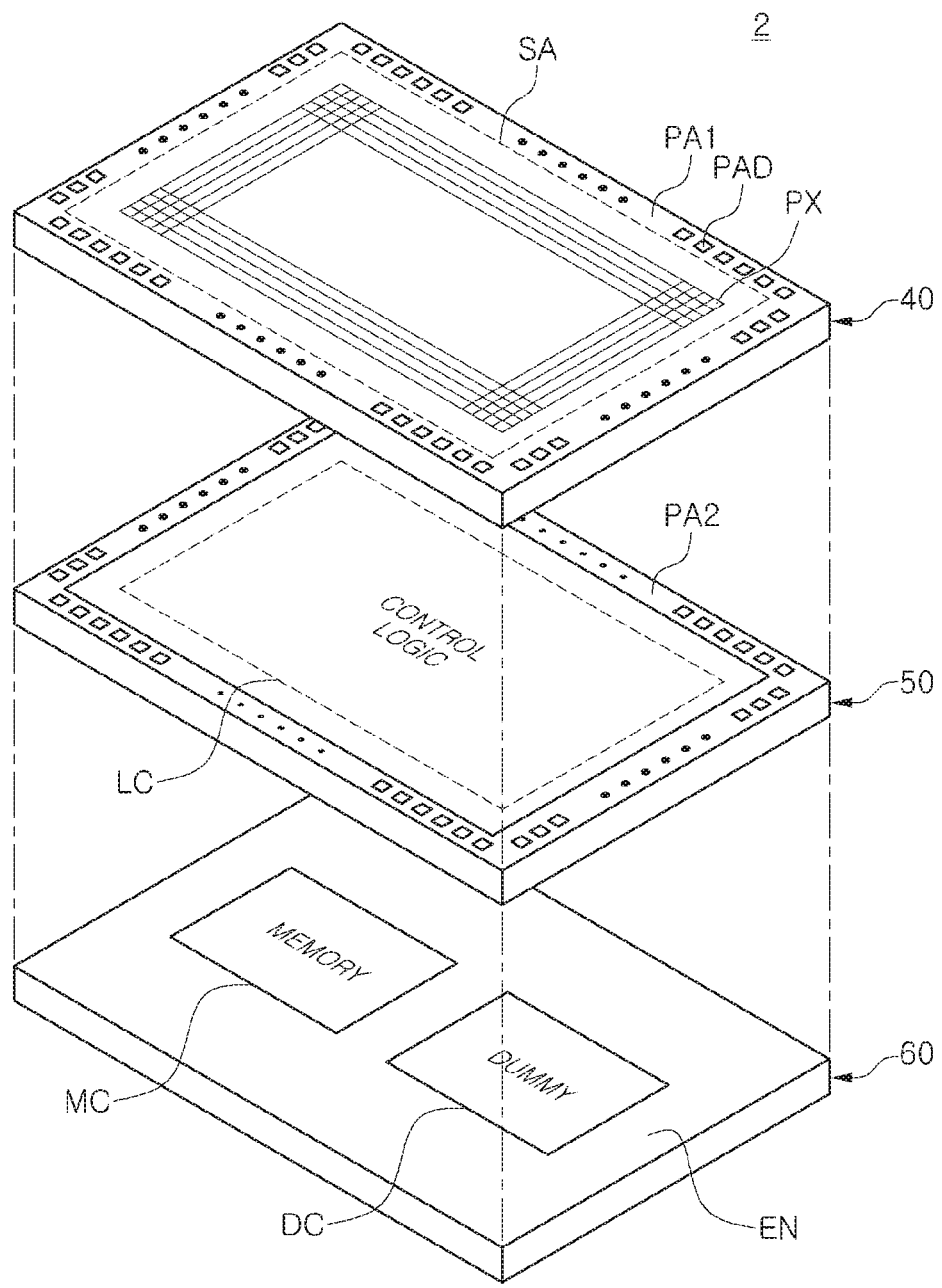
FIGS. 2 and 3 are views schematically illustrating an image sensor according to exemplary embodiments of the present inventive concept.
Figure 3:
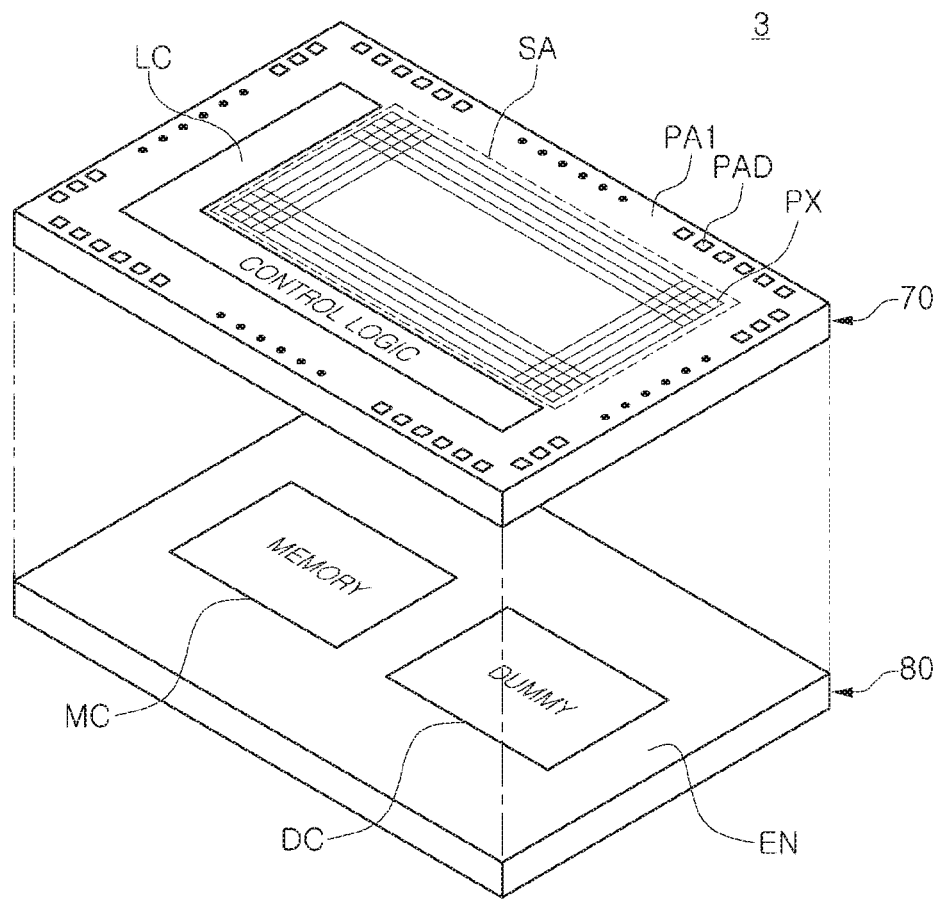

FIGS. 2 and 3 are views schematically illustrating an image sensor according to exemplary embodiments of the present inventive concept.

First, referring to FIG. 2, an image sensor 2 according to an exemplary embodiment of the present inventive concept may include a first layer 40, a second layer 50 provided below the first layer 40, a third layer 60 provided below the second layer 50, and the like. The first layer 40, the second layer 50, and the third layer 60 may be stacked on each other, e.g., in a direction perpendicular to surfaces thereof. In an exemplary embodiment of the present inventive concept, the first layer 40 and the second layer 50 may be stacked on each other at a wafer level, and the third layer 60 may be attached to a lower portion of the second layer 50 at a chip level. The first to third layers 40 to 60 may be provided in one semiconductor package.

The first layer 40 may include a sensing area SA in which the plurality of pixels PX are provided, and a first pad area PA1 provided in a periphery of the sensing area SA. The first pad area PA1 may include a plurality of upper pads PAD, and the plurality of upper pads PAD may be connected to pads provided in a second pad area PA2 of the second layer 50 and a control logic LC through vias or the like.

Each of the plurality of pixels PX may include a photodiode receiving light to generate a charge, a pixel circuit processing the charge generated by the photodiode, and the like. The pixel circuit may include a plurality of transistors for outputting a voltage corresponding to the charge generated by the photodiode.

The second layer 50 may include a plurality of devices providing the control logic LC. The plurality of devices included in the control logic LC may provide circuits for driving the pixel circuit provided in the first layer 40, for example, a row driver, a column driver, a timing controller, and the like. The plurality of devices included in the control logic LC may be connected to the pixel circuit through the first and second pad areas PA1 and PA2. The control logic LC may generate a pixel signal by obtaining the reset voltage and the pixel voltage from the plurality of pixels PX.

In an exemplary embodiment of the present inventive concept, at least one of the plurality of pixels PX may include a plurality of photodiodes disposed at the same level. Pixel signals generated from charges of each of the plurality of photodiodes may have a phase difference from one another, and the control logic LC may provide an autofocusing function based on the phase difference of the pixel signals generated from the plurality of photodiodes included in one pixel PX.

The third layer 60 provided below the second layer 50 may include a memory chip MC, a dummy chip DC, and a protective layer EN for sealing the memory chip MC and the dummy chip DC. The memory chip MC may be a dynamic random access memory (DRAM) or a static random access memory (SRAM), and the dummy chip DC may not have a function of actually storing data. The memory chip MC may be electrically connected to at least a portion of the devices included in the control logic LC of the second layer 50 by bumps, and may store information to provide an autofocusing function. In an exemplary embodiment of the present inventive concept, the bumps may be microbumps.

Next, referring to FIG. 3, an image sensor 3 according to an exemplary embodiment of the present inventive concept may include a first layer 70 and a second layer 80. The first layer 70 may include the sensing area SA in which the plurality of pixels PX are provided, the control logic LC in which devices for driving the plurality of pixels PX are provided, and the first pad area PA1 provided at a periphery of the sensing area SA and the control logic LC. The first pad area PA1 may include the plurality of upper pads PAD, and the plurality of upper pads PAD may be connected to the memory chip MC provided in the second layer 80 through a via, or the like. The second layer 80 may include the memory chip MC, the dummy chip DC, and the protective layer EN for sealing the memory chip MC and the dummy chip DC.

Figure 4:
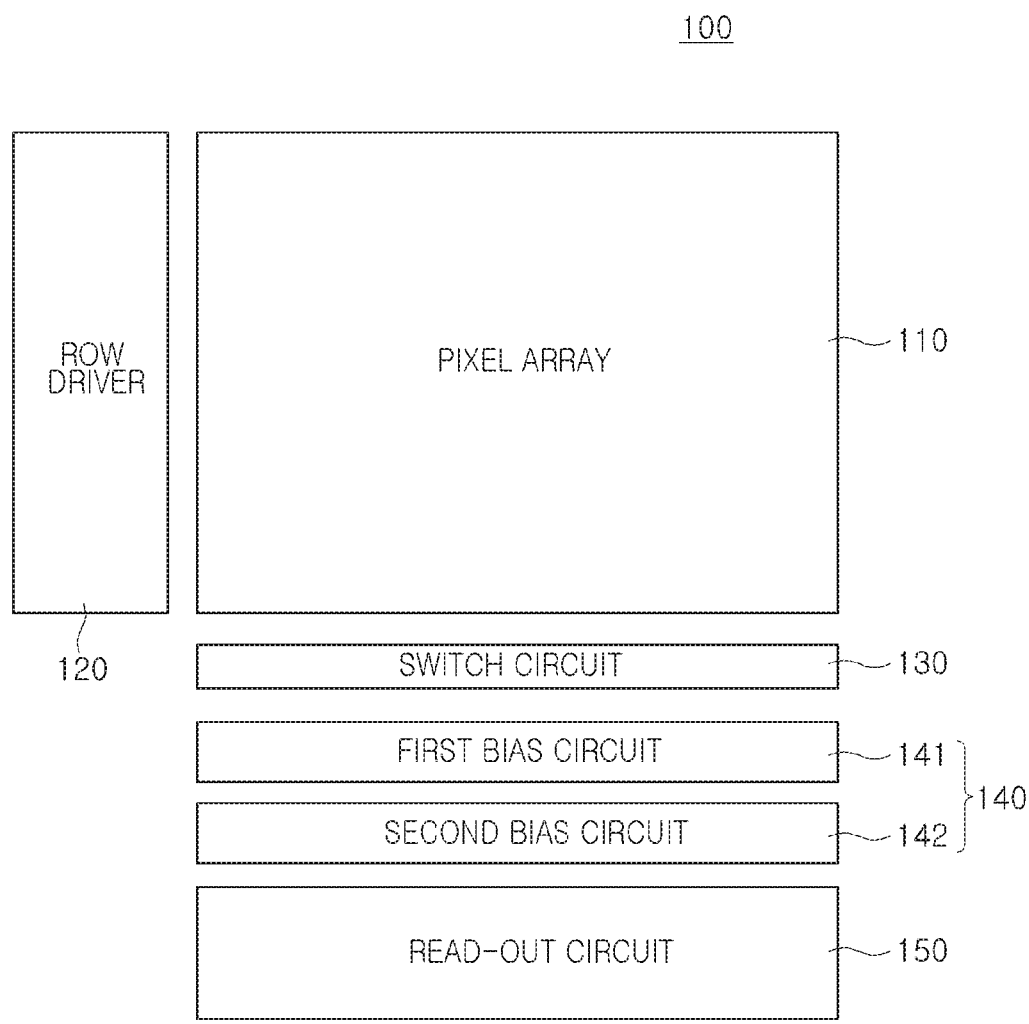
FIG. 4 is a view provided to illustrate an operation of an image sensor according to an exemplary embodiment of the present inventive concept.

FIG. 4 is a view provided to illustrate an operation of an image sensor according to an exemplary embodiment of the present inventive concept. Referring to FIG. 4, an image sensor 100 may include a pixel array 110, a row driver 120, a switch circuit 130, a bias circuit 140, a read-out circuit 150, and the like. The bias circuit 140 may include a first bias circuit 141 outputting a first bias current, and a second bias circuit 142 outputting a second bias current. The switch circuit 130 may connect each of a plurality of column lines connected to the plurality of pixels in the pixel array 110 to the first bias circuit 141 or the second bias circuit 142.

Figure 5:
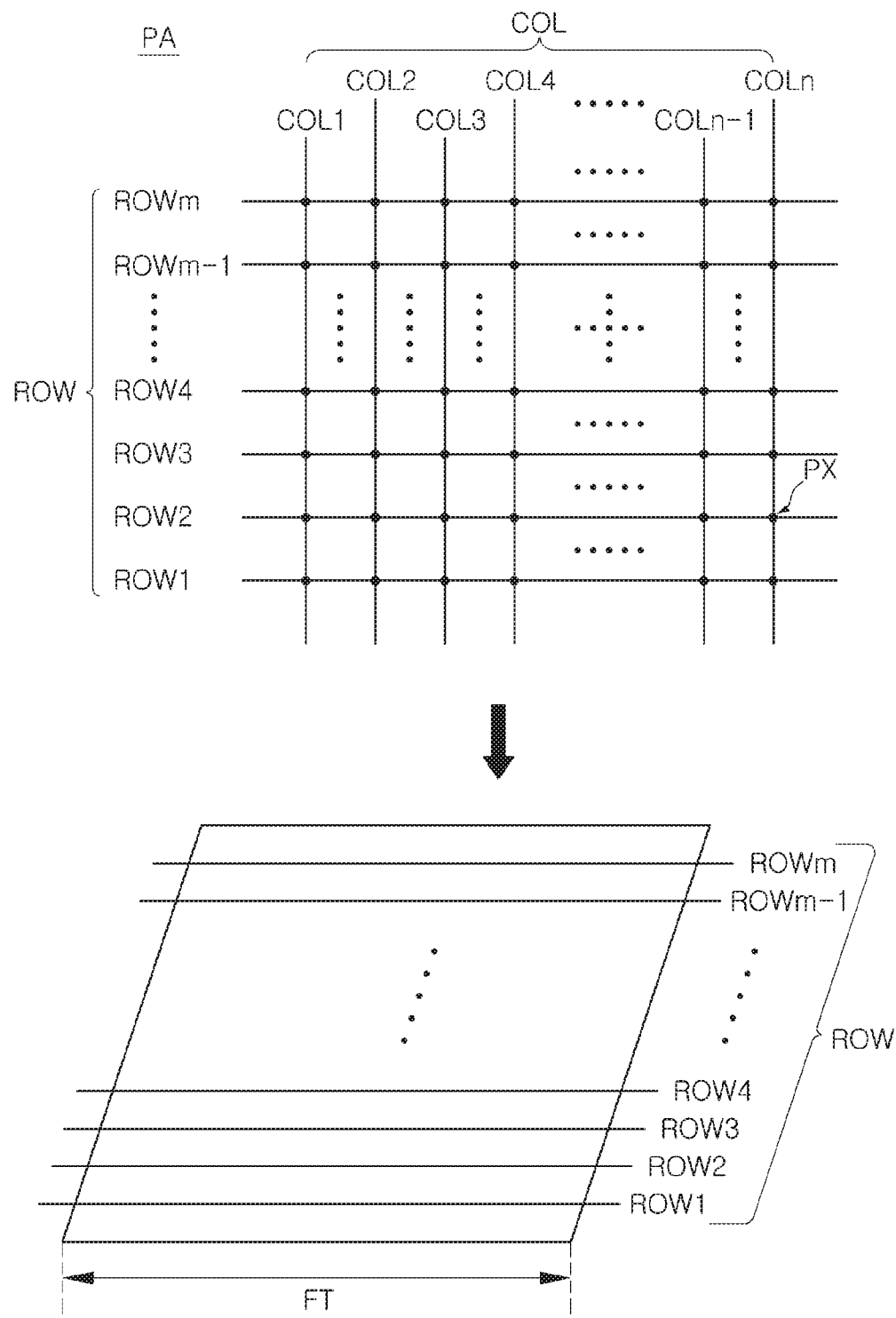
FIG. 5 is a view provided to illustrate an operation of an image sensor according to an exemplary embodiment of the present inventive concept.

FIG. 5 is a view provided to illustrate an operation of an image sensor according to an exemplary embodiment of the present inventive concept. Referring to FIG. 5, a pixel array PA of the image sensor according to an exemplary embodiment of the present inventive concept may include the plurality of pixels PX. The plurality of pixels PX may be connected to a plurality of row lines ROW ($ROW_1$ to $ROW_m$) and a plurality of column lines COL ($COL_1$ to $COL_n$). The image sensor may drive the plurality of pixels PX in units of the plurality of row lines ROW. For example, a time required for driving a selection driving line among the row lines ROW and reading the reset voltage and the pixel voltage from the pixels PX connected to the selection driving line may be defined as one horizontal period. The image sensor may operate in a rolling shutter method of sequentially driving the plurality of row lines ROW.

Meanwhile, a frame time period FT of the image sensor may be defined as a time required for reading the reset voltage and the pixel voltage from all the pixels PX included in the pixel array PA. For example, the frame time period FT may be greater than or equal to a product of the number of row lines ROW and the horizontal period. The shorter the frame time period FT of the image sensor, the more the image sensor may generate a greater number of image frames during the same time.

Power consumption of the image sensor may be defined as a product of a power supply voltage applied to the pixel PX and a current flowing in the pixel PX. A low power image sensor may be achieved by reducing the power supply voltage applied to the pixel PX or by reducing the current in the pixel PX.

According to an exemplary embodiment of the present inventive concept, the bias circuit 140 may output the second bias current to the column lines COL for at least a portion of a time at which the first bias current is input to the column lines COL connected to the pixels PX in one horizontal period. A settling time for stabilizing the voltages of the column lines COL may be shortened by using the first bias current and the second bias current. Therefore, the performance of the image sensor 100 may be improved without significantly increasing the amount of current flowing in the pixel PX.

According to an exemplary embodiment of the present inventive concept, a boosting capacitor may be used to increase capacitance of a floating diffusion to reduce the power supply voltage applied to the pixel PX. According to an exemplary embodiment of the present inventive concept, the power supply voltage applied to the pixel PX may be reduced by supplying a negative bias voltage to a photodiode and the floating diffusion. Therefore, a low power image sensor may be realized.

Figure 6:
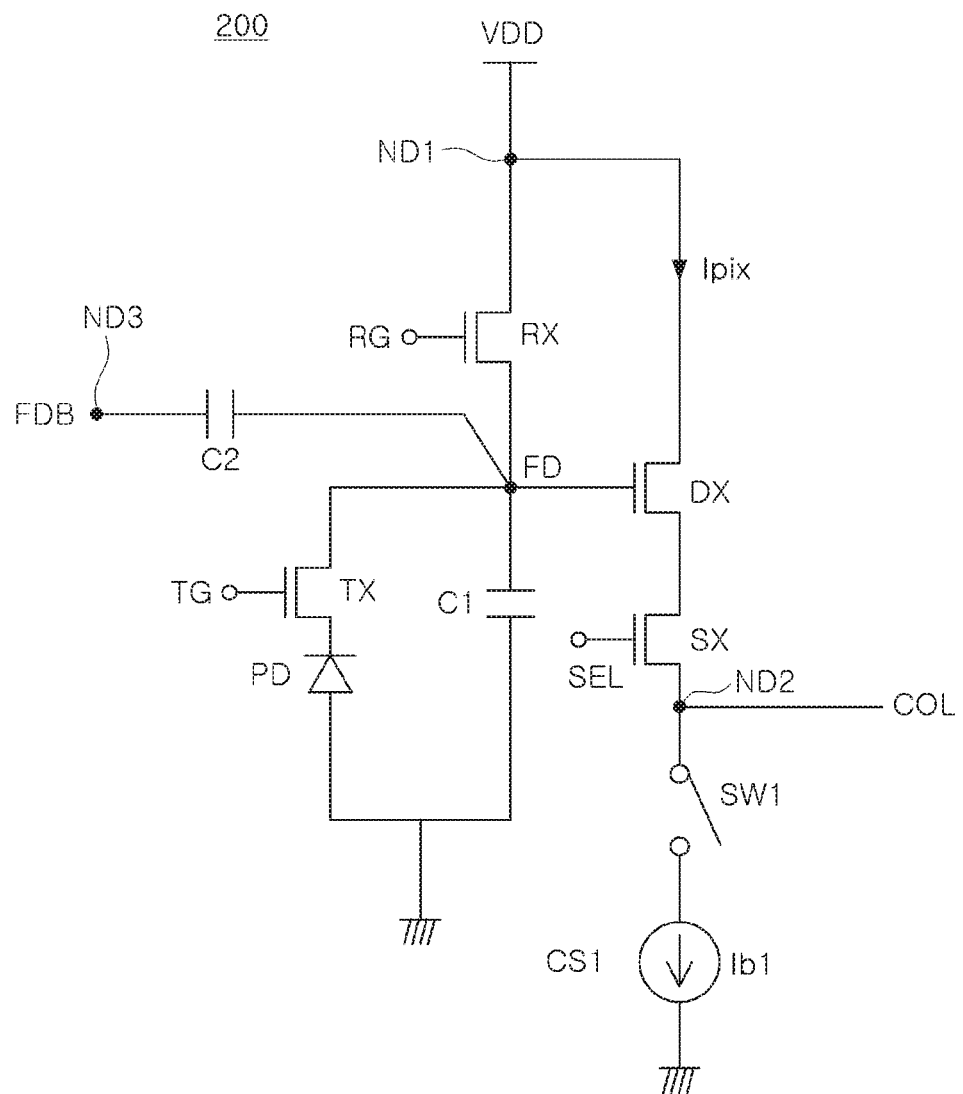
FIG. 6 is a view provided to illustrate an operation of an image sensor according to an exemplary embodiment of the present inventive concept.

FIG. 6 is a view provided to illustrate an operation of an image sensor according to an exemplary embodiment of the present inventive concept. Referring to FIG. 6, a pixel included in an image sensor 200 may include a photodiode PD generating a charge in response to light, a pixel circuit processing the charge generated by the photodiode PD and outputting an electric signal, and the like. For example, the pixel circuit may include a floating diffusion FD, a boosting capacitor C2, a reset transistor RX, a driving transistor DX, a selection transistor SX, a transfer transistor TX, and the like.

The reset voltage and the pixel voltage of the pixel may be output to the column line COL through an output node ND2. The image sensor 200 may include a first switch SW1 and a first current circuit CS1. The first switch SW1 may connect the first current circuit CS1 to the column line COL.

The first switch SW1 may control the first current circuit CS1 to supply a first bias current Ib1 to the column line COL while a read-out operation for the pixel is performed.

The reset transistor RX may be connected between a power supply node ND1 supplying a power supply voltage VDD and the floating diffusion FD, and may be controlled by a reset control signal RG. For example, when the reset transistor RX is turned on, the voltage of the floating diffusion FD may be reset to the power supply voltage VDD. When the voltage of the floating diffusion FD is reset, the selection transistor SX may be turned on by a selection control signal SEL, such that the reset voltage may be output to the column line COL through the output node ND2.

In an exemplary embodiment of the present inventive concept, the photodiode PD may generate electrons or holes as main charge carriers in response to light. When the transfer transistor TX is turned on in response to a transmission control signal TG after the reset voltage is output to the column line COL, the charge generated by the photodiode PD may move to the floating diffusion FD. The driving transistor DX may operate as a source follower amplifier for amplifying the voltage of the floating diffusion FD. A current Ipix may flow through the driving transistor DX. When the selection transistor SX is turned on by the selection control signal SEL, the pixel voltage corresponding to the charge generated by the photodiode PD may be output to the column line COL through the output node ND2.

Since the floating diffusion FD accumulates a charge corresponding to the reset voltage or a charge corresponding to the pixel voltage, the floating diffusion FD may be modeled as a capacitor C1 unique to the floating diffusion FD. The boosting capacitor C2 may be connected between the floating diffusion FD and a control node ND3. The control node ND3 may output a boosting control signal FDB to the boosting capacitor C2. The boosting control signal FDB may control a capacitance of the floating diffusion FD. According to the boosting control signal FDB, the capacitance of the floating diffusion FD may correspond to a sum of the capacitance of the capacitor C1 and the capacitance of the boosting capacitor C2, but is not limited thereto.

Each of the reset voltage and the pixel voltage may be detected by a sampling circuit connected to the column line COL. The sampling circuit may include a plurality of samplers having a first input terminal and a second input terminal, and the sampler may receive a ramp voltage through the first input terminal. The sampler may compare the ramp voltage input to the first input terminal and the reset voltage or the pixel voltage input to the second input terminal. An analog-to-digital converter (ADC) may be connected to an output terminal of the sampler, and the analog-to-digital converter may output reset data corresponding to a comparison result of the ramp voltage and the reset voltage, and pixel data corresponding to a comparison result of the ramp voltage and the pixel voltage. A control logic may generate image data by using the pixel signal corresponding to the difference between the reset data and the pixel data.

In an exemplary embodiment of the present inventive concept, the power supply voltage VDD applied to the pixel may be reduced by increasing the capacitance of the floating diffusion FD using the boosting capacitor C2.

Figure 7:
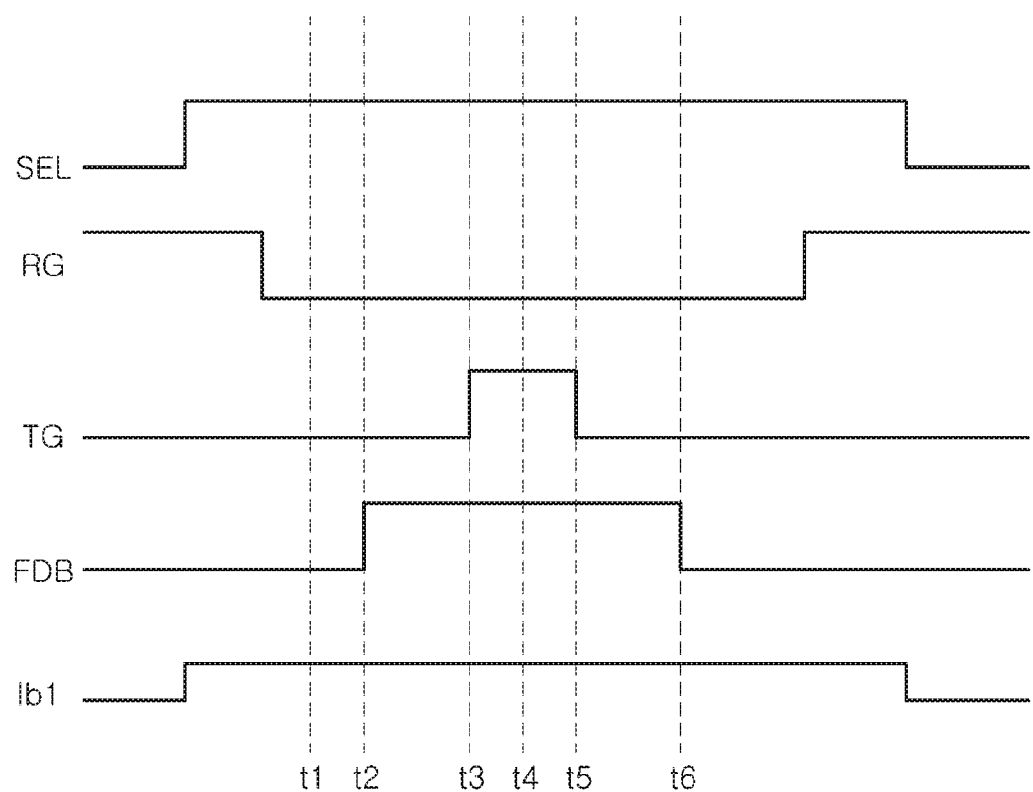
FIG. 7 is a timing diagram illustrating an operation of the image sensor of FIG. 6 according to an exemplary embodiment of the present inventive concept.
Figure 8A:
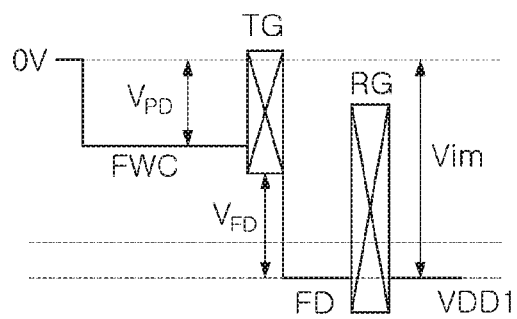
FIGS. 8A and 8B are diagrams illustrating a change in potential barriers of elements constituting a unit pixel in the image sensor of FIG. 6 according to an exemplary embodiment of the present inventive concept.
Figure 8B:
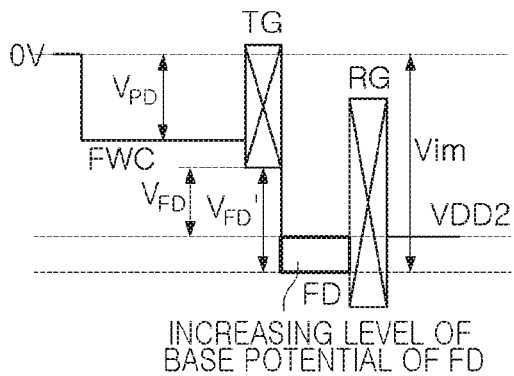

FIG. 7 is a timing diagram illustrating an operation of the image sensor of FIG. 6 according to an exemplary embodiment of the present inventive concept, and FIGS. 8A and 8B are diagrams illustrating a change in a potential barrier of elements constituting a unit pixel in the image sensor of FIG. 6 according to an exemplary embodiment of the present inventive concept.

FIG. 8A illustrates a potential level when a boosting control signal is at a low level, and FIG. 8B illustrates a potential level when the boosting control signal is at a high level. In FIGS. 8A and 8B, a potential in a vertical direction, e.g., a voltage level, illustrates a negative potential upwards and a positive potential downwards. A full well capacity (FWC) is the amount of charge an individual pixel can hold before saturating.

Referring to FIGS. 7 and 8A, at t1, the selection control signal SEL may have a high level, and the reset control signal RG may have a low level. FIG. 8A illustrates a potential level at t1. A potential Vim of the image sensor may be a sum of a potential $V_{PD}$ of the photodiode and a potential $V_{FD}$ of the floating diffusion.

To increase the potential Vim of the image sensor, the potential $V_{PD}$ of the photodiode may be increased. To increase the potential $V_{PD}$ of the photodiode, a voltage difference between a ground voltage 0 V and a first power supply voltage VDD1 may be increased. However, when the voltage difference between the ground voltage 0 V and the first power supply voltage VDD1 is increased, the power consumption of the image sensor may also increase.

Referring to FIGS. 7 and 8A together, the boosting control signal FDB may transition from a low level to a high level at t2. The boosting control signal FDB may maintain a high level for a period from t2 to t6. After the boosting control signal FDB transitions from the low level to the high level, the transmission control signal TG may transition from the low level to the high level at t3. When the transmission control signal TG transitions from the low level to the high level, the transmission transistor TX is turned on.

At t4, the boosting control signal FDB may have a high level, and the transmission control signal TG may have a high level. FIG. 8B illustrates a potential level at t4. While the boosting control signal FDB is maintained at a high level, the capacitance of the floating diffusion FD may increase, and a base potential level $V_{FD}'$ of the floating diffusion FD may increase in the negative direction, as compared with a base potential level $V_{FD}$ of the floating diffusion FD when the boosting control signal FDB is at the low level in FIG. 8A. In other words, an absolute value of the base potential level of the floating diffusion FD may increase. Accordingly, even when a second power supply voltage VDD2, which is lower than the first power supply voltage VDD1, is applied, the potential Vim of the image sensor may be realized equally.

When the transfer transistor TX is turned on, the charge generated when the photodiode PD is exposed to light may move to the floating diffusion FD. After the charge generated in the photodiode PD moves to the floating diffusion FD, the transfer transistor TX may be turned off at t5. After the transfer transistor TX is turned off, the boosting control signal FDB may transition from the high level to the low level at t6.

The image sensor 200 according to an exemplary embodiment of the present inventive concept may increase the capacitance of the floating diffusion FD for a time from t2 to t6 by using the boosting capacitor C2. Therefore, while the transfer transistor TX is turned on and the charge of the photodiode PD moves to the floating diffusion FD, the capacitance of the floating diffusion FD may increase, and the power supply voltage VDD applied to the pixel, to implement the same potential Vim in the image sensor, may be reduced. Therefore, the power consumption of the image sensor may be reduced.

Figure 9:
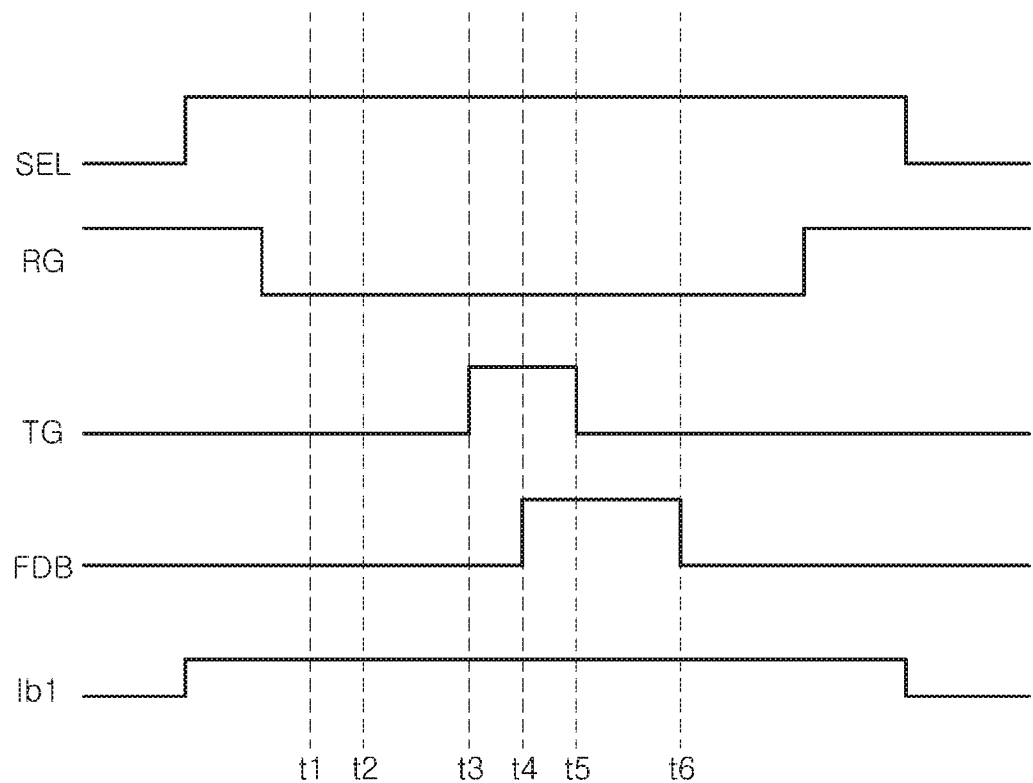
FIG. 9 is a timing diagram illustrating an operation of an image sensor according to an exemplary embodiment of the present inventive concept.

FIG. 9 is a timing diagram illustrating an operation of an image sensor according to an exemplary embodiment of the present inventive concept. Unlike FIG. 7, in FIG. 9, after the transmission control signal TG transitions from the low level to the high level at t3, the boosting control signal FDB may transition from the low level to the high level at t4. When the boosting control signal FDB transitions from the low level to the high level after the transfer transistor TX is turned on, the charges in the photodiode PD region may be left without passing over to the floating diffusion FD region. The remaining charges may act as error factors of the image sensor 200 such as leakage or the like.

Figure 10:
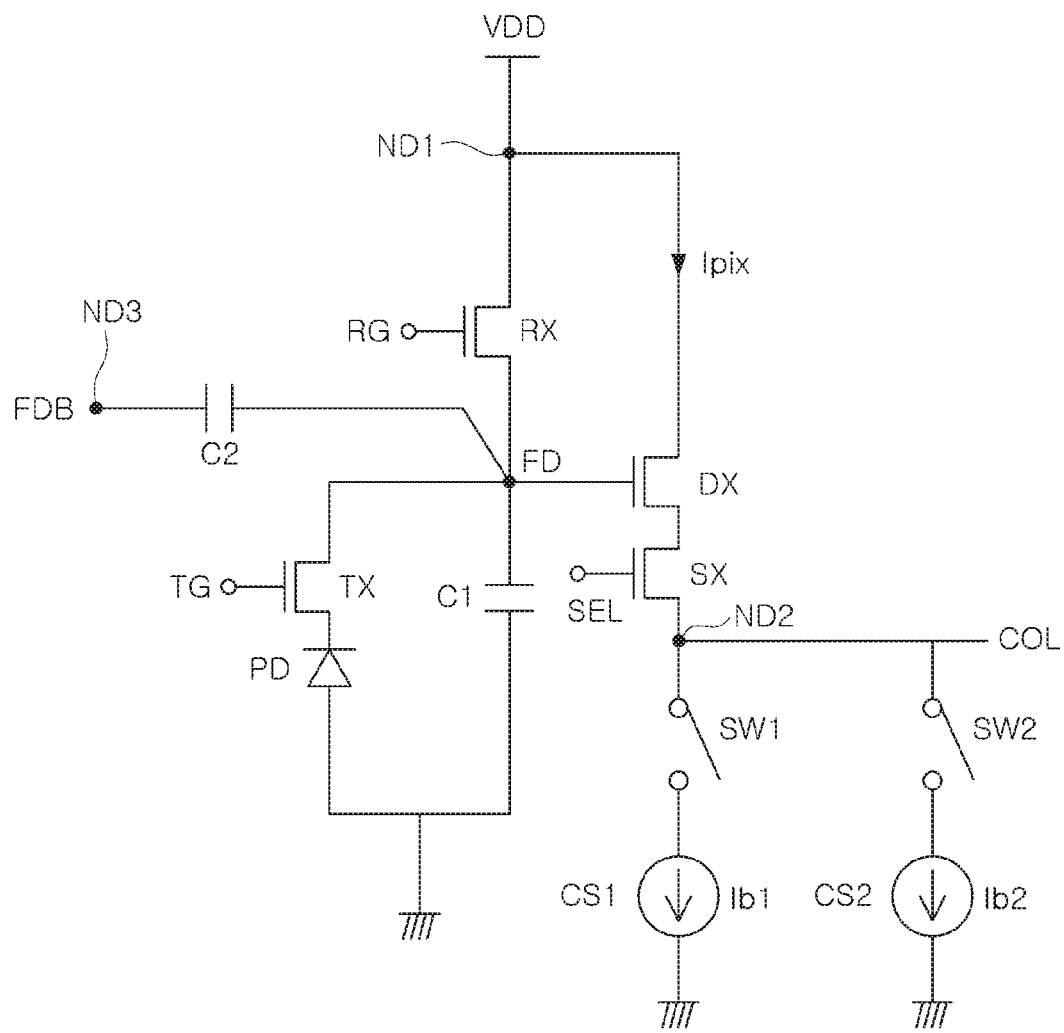
FIG. 10 is a view provided to illustrate an operation of an image sensor according to an exemplary embodiment of the present inventive concept.

FIG. 10 is a view provided to illustrate an operation of an image sensor according to an exemplary embodiment of the present inventive concept. Unlike the image sensor 200 of FIG. 6, an image sensor 300 of FIG. 10 may further include a second switch SW2 and a second current circuit CS2. The second switch SW2 may connect the second current circuit CS2 to the column line COL.

The first current circuit CS1 may supply the first bias current Ib1 to the column line COL, and the second current circuit CS2 may supply a second bias current Ib2 to the column line COL. The first bias current Ib1 and the second bias current Ib2 may have different magnitudes, but are not limited thereto, and may have the same magnitude as each other.

According to an exemplary embodiment of the present inventive concept, the second switch SW2 may control the second current circuit CS2 such that the second bias current Ib2 is supplied only to the column line COL when necessary. For example, the second bias current Ib2 may be supplied to the column line COL in at least a portion of a time at which the first bias current Ib1 is supplied to the column line COL.

During a read-out operation of the image sensor 300, since the second bias current Ib2 is supplied to the column line COL only at the required time, a settling time may be shortened without significantly increasing an amount of the current Ipix flowing through the driving transistor DX. Therefore, an operating speed of the image sensor 300 may be improved with low power.

Figure 11:
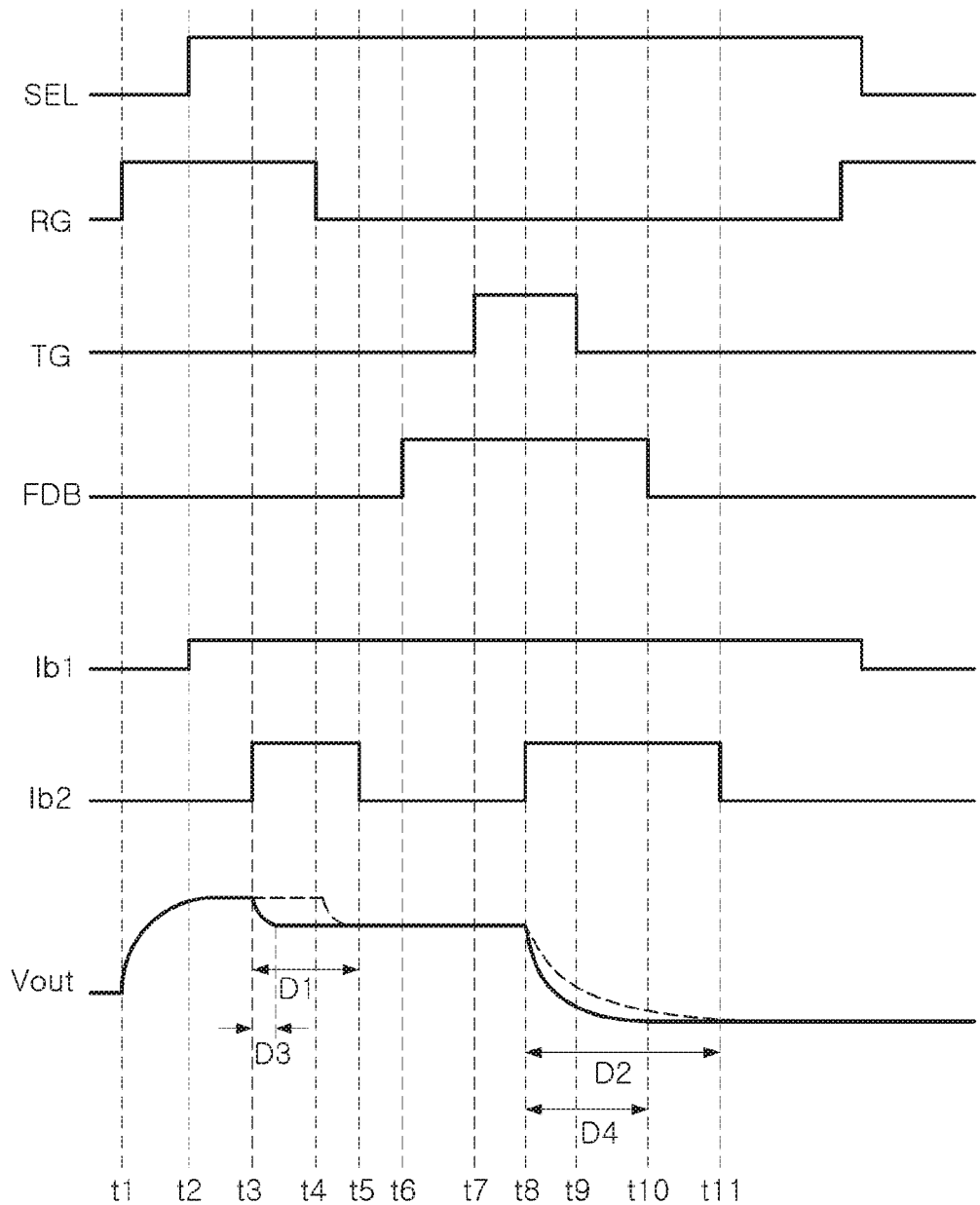
FIG. 11 is a timing diagram illustrating an operation of an image sensor during a horizontal scan time of one cycle according to an exemplary embodiment of the present inventive concept.

FIG. 11 is a timing diagram illustrating an operation of an image sensor during a horizontal scan time of one cycle according to an exemplary embodiment of the present inventive concept. Referring to FIGS. 10 and 11 together, the reset control signal RG may transition from a low level to a high level at t1. When the reset control signal RG transitions from the low level to the high level, the reset transistor RX may be turned on. When the reset transistor RX is turned on, a voltage of the floating diffusion FD may be reset to the power supply voltage VDD.

When the voltage of the floating diffusion FD is reset to the power supply voltage VDD, the selection control signal SEL may transition from the low level to the high level at t2. When the selection control signal SEL transitions from the low level to the high level, the selection transistor SX may be turned on. When the selection transistor SX is turned on, the reset voltage may be output to the column line COL through the output node ND2.

The selection control signal SEL may maintain a high level in a period from t2 to t11. The selection transistor TX may maintain a turned on state while the selection control signal SEL is maintained at a high level. The first bias current Ib1 of the first current circuit CS1 may be provided to the column line COL while the selection transistor SX is maintained in a turned on state.

The second bias current Ib2 of the second current circuit CS2 may be provided to the column line COL from t3 to t5. The reset control signal RG may transition from the high level to the low level at t4 while the second bias current Ib2 of the second current CS2 circuit is provided to the output node ND2 from t3 to t5. When the reset control signal RG transitions from the high level to the low level, the reset transistor RX may be turned off.

When the reset transistor RX is turned off, a reset settling time to stabilize the reset voltage of the column line COL connected to the pixel may be taken. A reset settling time D3 when providing the second bias current Ib2 to the column line COL may be shorter than a reset settling time D1 when not providing the second bias current Ib2 to the column line COL.

Therefore, when the reset control signal RG decreases from the high level to the low level while the second bias current Ib2 of the second current circuit CS2 is provided to the column line COL, the reset settling time may be shortened. After the reset voltage has stabilized, the reset voltage may be sampled during a reset sampling time.

At t6, the boosting control signal FDB may transition from the low level to the high level. The boosting control signal FDB may maintain a high level for a period from t6 to t10.

After the boosting control signal FDB transitions from the low level to the high level, the transmission control signal TG may transition from the low level to the high level at t7. When the transmission control signal TG transitions from the low level to the high level, the transmission transistor TX may be turned on. When the transfer transistor TX is turned on, the charge generated when the photodiode PD is exposed to light may move to the floating diffusion FD.

The second bias current Ib2 of the second current circuit CS2 may be provided to the column line COL from t8 to t11. The transmission control signal TG may transition from the high level to the low level at t9 while the second bias current Ib2 of the second current circuit CS2 is provided to the column line COL. When the transmission control signal TG transitions from the high level to the low level, the transfer transistor TX may be turned off. After the transfer transistor TX is turned off, the boosting control signal FDB may transition from the high level to the low level at t10.

When the transfer transistor TX is turned off, a pixel settling time to stabilize the pixel voltage of the column line connected to the pixel may be taken. A pixel settling time D4 when providing the second bias current Ib2 to the column line COL may be shorter than a pixel settling time D2 when not providing the second bias current Ib2 to the column line COL.

Therefore, when the transmission control signal TG decreases from the high level to the low level while the second bias current Ib2 of the second current circuit CS2 is provided to the column line COL, the pixel settling time may be shortened. After the pixel voltage is stabilized, the pixel voltage may be sampled during a pixel sampling time.

According to an exemplary embodiment of the present inventive concept, a total read-out time may include the reset settling time, the reset sampling time, the pixel settling time, and the pixel sampling time. The image sensor 300 according to an exemplary embodiment of the present inventive concept may shorten the reset settling time and the pixel settling time by supplying the second bias current Ib2 only at a necessary time. Therefore, the total read-out time may be shortened without significantly increasing an amount of the current Ipix flowing through the driving transistor DX.

Figure 12:
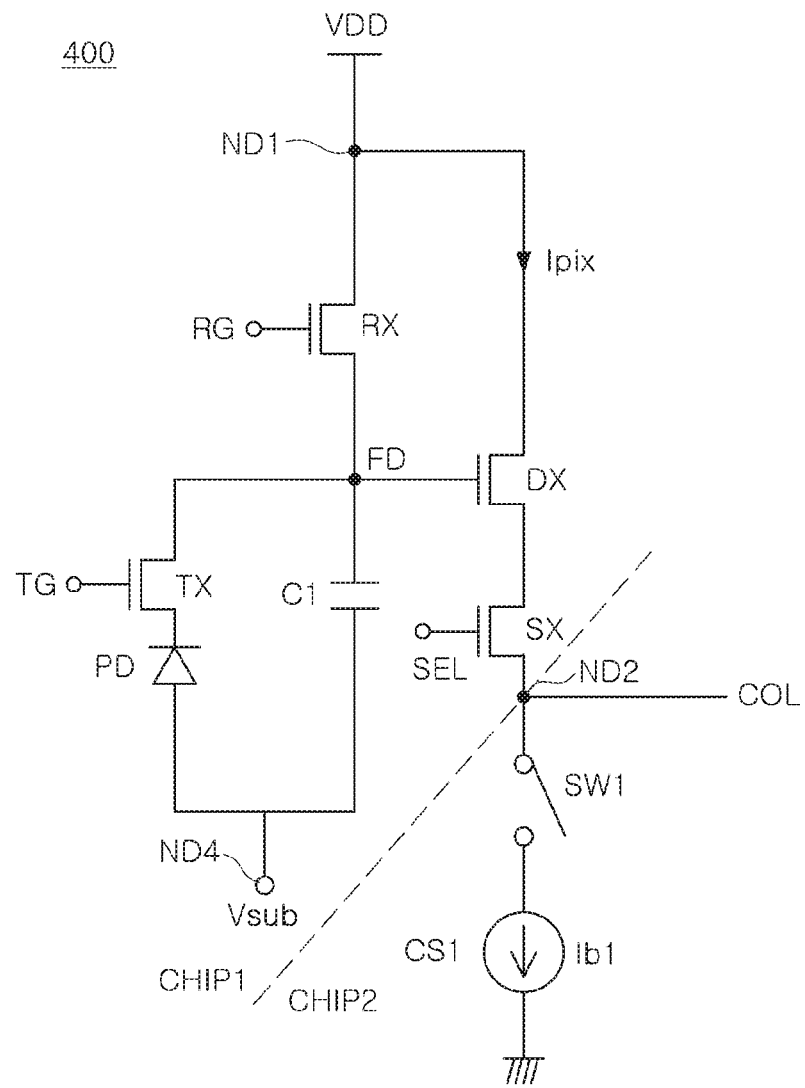
FIG. 12 is a view provided to illustrate an operation of an image sensor according to an exemplary embodiment of the present inventive concept.

FIG. 12 is a view provided to illustrate an operation of an image sensor according to an exemplary embodiment of the present inventive concept. Referring to FIG. 12, in an image sensor 400, a sensing area in which the plurality of pixels PX are provided may be disposed in a first semiconductor chip CHIP1, and a control logic area for driving the plurality of pixels PX may be disposed in a second semiconductor chip CHIP2.

Each of the plurality of pixels PX may include the photodiode PD that receives light to generate a charge, a pixel circuit that processes the charge generated by the photodiode PD, and the like. The pixel circuit may include a plurality of transistors RX, TX, DX, and SX for outputting a voltage corresponding to the charge generated by the photodiode PD. The reset transistor RX may reset the voltage of the floating diffusion FD to the power supply voltage VDD in response to the reset control signal RG. The transfer transistor TX may transfer the charge generated by the photodiode PD to the floating diffusion in response to the transmission control signal TG. A source follower (driving) transistor DX may generate a voltage signal corresponding to the charge accumulated in the floating diffusion FD, and the selection transistor SX may transmit the voltage signal to the output node ND2 in response to the selection control signal SEL.

The plurality of devices included in the control logic LC may provide circuits for driving the pixel circuit provided in the first semiconductor chip CHIP1, for example, a row driver, a bias circuit, a read-out circuit, and the like.

The second semiconductor chip CHIP2 may be connected to the output node ND2 included in the first semiconductor chip CHIP1 through a metal pad. According to an exemplary embodiment of the present inventive concept, the first semiconductor chip CHIP1 may be included in a first layer, and the second semiconductor chip CHIP2 may be included in a second layer. The first layer and the second layer may be stacked on each other.

The first semiconductor chip CHIP1 may include a first power (power supply) node ND1 for supplying the power supply voltage VDD and a second power node ND4 for supplying a bias voltage Vsub. The second power node ND4 may supply the bias voltage Vsub to the photodiode PD and the floating diffusion FD included in the first semiconductor chip CHIP1. The bias voltage Vsub may be a negative voltage with respect to the ground voltage of the second semiconductor chip CHIP2.

Since the image sensor 400 according to an exemplary embodiment of the present inventive concept may supply the bias voltage Vsub corresponding to the negative voltage to the first semiconductor chip CHIP1, the image sensor 400 may realize the potential Vim even when the magnitude of the power supply voltage VDD is reduced. Therefore, a low power image sensor may be realized.

Figure 13:
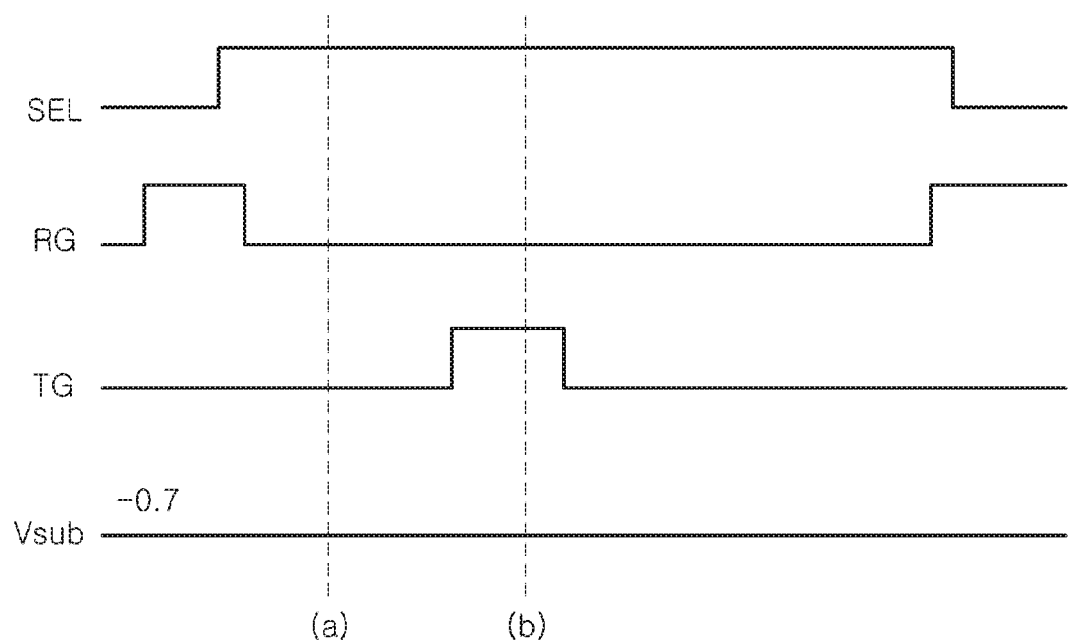
FIG. 13 is a timing diagram illustrating an operation of the image sensor of FIG. 12 according to an exemplary embodiment of the present inventive concept.
Figure 14A:
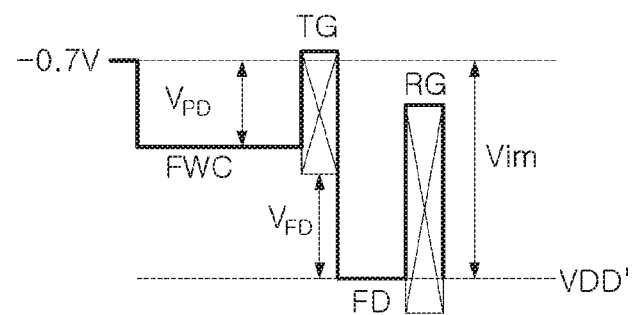
FIGS. 14A and 14B are diagrams illustrating a change in potential barriers of elements constituting a unit pixel in the image sensor of FIG. 12 according to an exemplary embodiment of the present inventive concept.
Figure 14B:
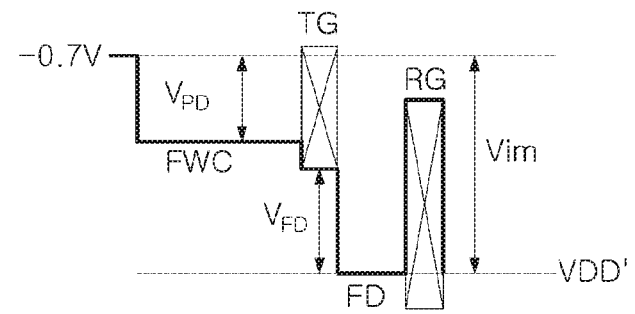

FIG. 13 is a timing diagram illustrating an operation of the image sensor of FIG. 12 according to an exemplary embodiment of the present inventive concept. FIGS. 14A and 14B are diagrams illustrating a change in a potential barrier of elements constituting a unit pixel in the image sensor of FIG. 12 according to an exemplary embodiment of the present inventive concept.

FIG. 14A illustrates a potential level when a boosting control signal is at a low level, and FIG. 14B illustrates a potential level when the boosting control signal is at a high level. In FIGS. 14A and 14B, a potential in a vertical direction, e.g., the voltage level, illustrates a negative potential toward the top and a positive potential toward the bottom.

Referring to FIG. 13 and FIG. 14A together, in FIG. 13, the selection control signal SEL may have a high level, the reset control signal RG may have a low level, and the transmission control signal TG may have a low level at a time (a). FIG. 14A illustrates the potential level at time (a) in FIG. 13. The potential Vim of the image sensor 400 may be the sum of the potential $V_{PD}$ of the photodiode and the potential $V_{FD}$ of the floating diffusion. Since the bias voltage Vsub is a voltage smaller than the ground voltage 0 V (e.g., −0.7 V), the potential Vim of the image sensor 400 may increase as compared to when the bias voltage Vsub is the ground voltage 0V.

Referring to FIG. 13 and FIG. 14B, the selection control signal SEL may have a high level, the reset control signal RG may have a low level, and the transmission control signal TG may have a high level at a time (b) in FIG. 13. FIG. 14B illustrates the potential level at time (b) in FIG. 13. Since the transfer control signal TG has a high level, a gate potential of the transfer transistor TX is lowered. When the gate potential of the transfer transistor TX is lowered, charges in the photodiode PD may be transferred to the floating diffusion FD.

The image sensor 400 according to an exemplary embodiment of the present inventive concept may supply a negative bias voltage Vsub that is smaller than the ground voltage 0V to the photodiode PD and the floating diffusion FD included in the first semiconductor chip CHIP1. When the bias voltage Vsub is a negative bias voltage, the potential Vim of the image sensor 400 may increase as compared to when the bias voltage Vsub is the ground voltage 0V. Therefore, since the potential Vim of the image sensor may be realized equally even if the size of a power supply voltage VDD' is reduced, a low power image sensor may be realized.

In addition, a sensing region in which the plurality of pixels PX are provided is disposed in the first semiconductor chip CHIP1, and a control logic region for driving the plurality of pixels PX is disposed in the second semiconductor chip CHIP2. Thus, a substrate of the sensing region and a substrate of the control logic region may be separated. Since the negative bias voltage can be supplied only to the substrate of the sensing region and the ground voltage can be supplied to the substrate of the control logic region, it is possible to prevent the elements included in the control logic region from being affected by the negative bias voltage supplied to the substrate of the sensing region.

Figure 15:
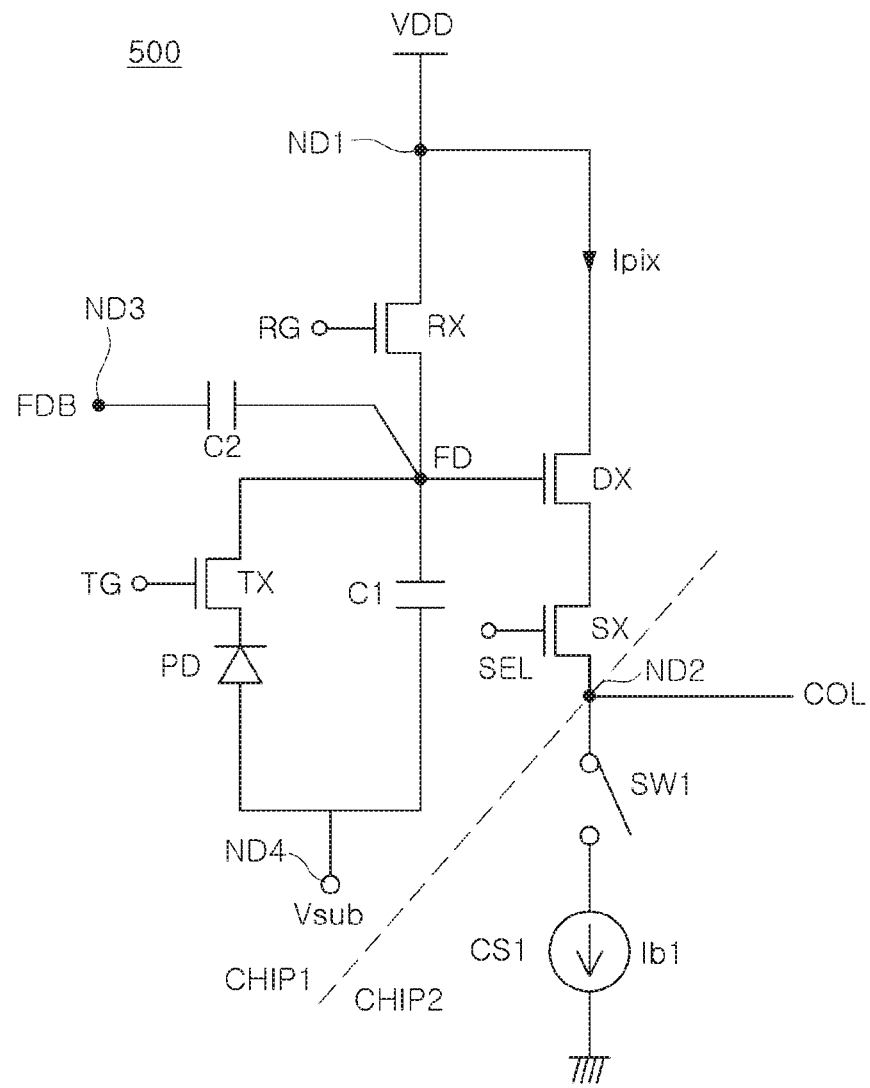
FIG. 15 is a view provided to illustrate an operation of an image sensor according to an exemplary embodiment of the present inventive concept.

FIG. 15 is a view provided to illustrate an operation of an image sensor according to an exemplary embodiment of the present inventive concept. Unlike the image sensor 400 of FIG. 12, in an image sensor 500 of FIG. 15, the first semiconductor chip CHIP1 may further include a boosting capacitor C2. The boosting capacitor C2 may be connected between the floating diffusion FD and a control node N3. The boosting control signal FDB may control capacitance of the floating diffusion FD. A capacity of the floating diffusion FD may be adjusted in response to the boosting control signal FDB.

In an exemplary embodiment of the present inventive concept, the power supply voltage VDD applied to the pixel may be reduced by increasing the capacitance of the floating diffusion FD using the boosting capacitor C2. According to an exemplary embodiment of the present inventive concept, the negative bias voltage Vsub may be supplied to the photodiode PD and the floating diffusion FD to reduce the power supply voltage VDD applied to the pixel. Thus, a low power image sensor may be realized.

Figure 16:
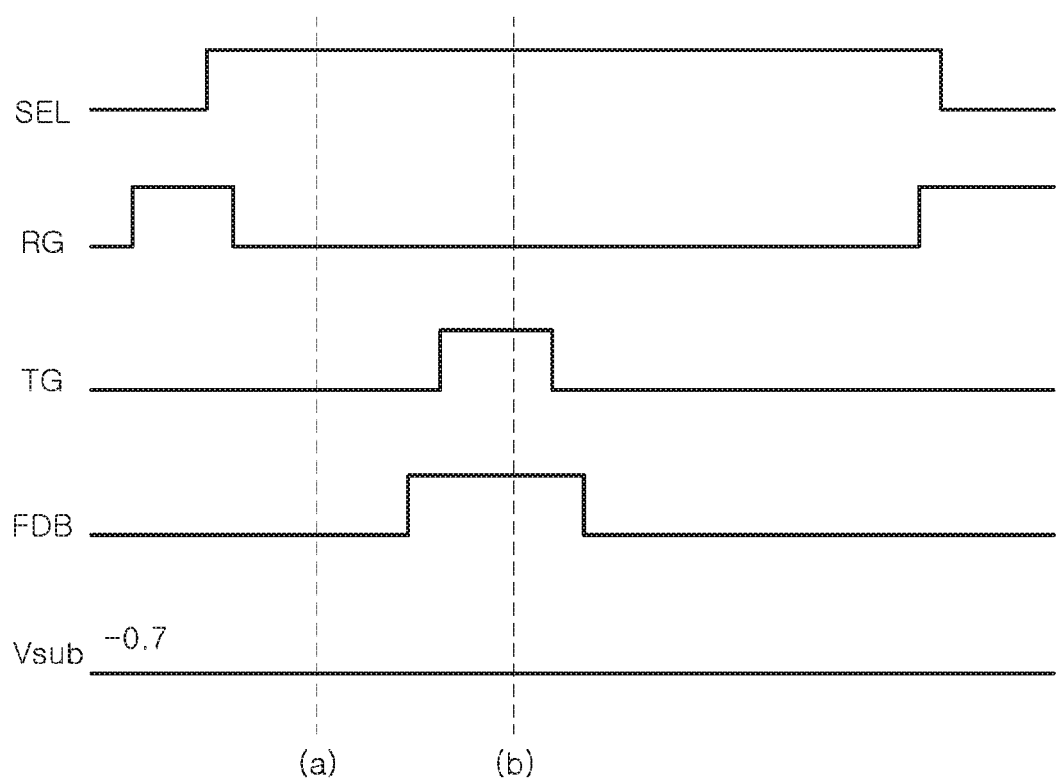
FIG. 16 is a timing diagram provided to illustrate an operation of the image sensor of FIG. 15 according to an exemplary embodiment of the present inventive concept.
Figure 17A:
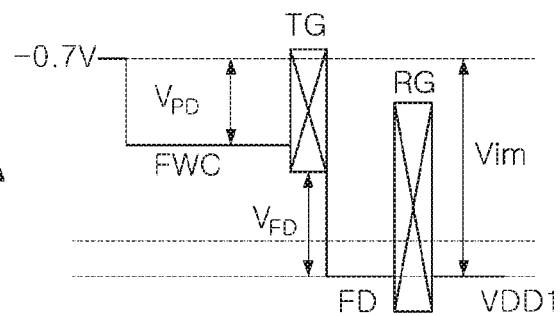
FIGS. 17A and 17B are diagrams illustrating a change in potential barriers of elements constituting a unit pixel in the image sensor of FIG. 15 according to an exemplary embodiment of the present inventive concept.
Figure 17B:
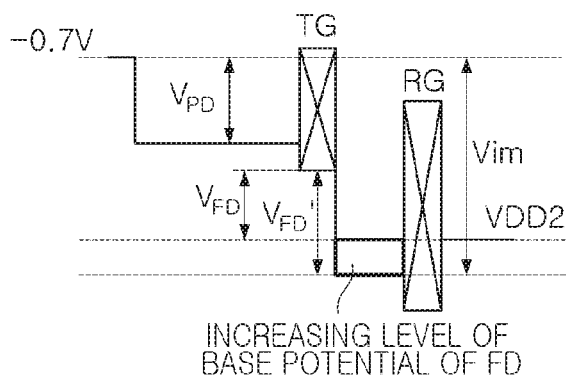

FIG. 16 is a timing diagram to illustrate an operation of the image sensor of FIG. 15 according to an exemplary embodiment of the present inventive concept, and FIGS. 17A and 17B are diagrams illustrating a change in a potential barrier of elements constituting a unit pixel in the image sensor of FIG. 15 according to an exemplary embodiment of the present inventive concept.

FIG. 17A illustrates a potential level when a boosting control signal is at a low level, and FIG. 17B illustrates a potential level when the boosting control signal is at a high level. In FIG. 17, a potential in the vertical direction, e.g., the voltage level, illustrates a negative potential toward the top, and a positive potential toward the bottom.

Referring to FIGS. 16 and 17A together, the selection control signal SEL may have a high level, the reset control signal RG is at a low level, and the transmission control signal TG may have a low level at a time (a) in FIG. 16. In addition, the boosting control signal FDB may have a low level. FIG. 17A illustrates a potential level at time (a) in FIG. 16. The potential Vim of the image sensor may be the sum of the potential $V_{PD}$ of the photodiode and the potential $V_{FD}$ of the floating diffusion. Since the bias voltage Vsub is a voltage smaller than the ground voltage 0V (e.g., −0.7V), the potential Vim of the image sensor may increase as compared to when the bias voltage Vsub is the ground voltage 0V.

Referring to FIGS. 16 and 17B together, the selection control signal SEL may have a high level, the reset control signal RG may have a low level, and the transmission control signal TG may have a high level at time (b) in FIG. 16. In addition, the boosting control signal FDB may have a high level. FIG. 17B illustrates a potential level at time (b) in FIG. 16. The capacitance of the floating diffusion FD may increase while the boosting control signal FDB is maintained at a high level, and the base potential level $V_{FD}'$ of the floating diffusion FD may increase in a negative direction, as compared to the ground potential level $V_{FD}$ of the floating diffusion FD when the boosting control signal FDB is at a low level. In other words, the absolute value of the ground potential level of the floating diffusion FD may increase. Accordingly, even when the second power supply voltage VDD2, which is lower than the first power supply voltage VDD1, is applied, the potential Vim of the image sensor may be realized equally.

In addition, since the transmission control signal TG has a high level, the gate potential of the transfer transistor TX is lowered. When the gate potential of the transfer transistor TX is lowered, charges in the photodiode PD may be transferred to the floating diffusion FD.

Figure 18:
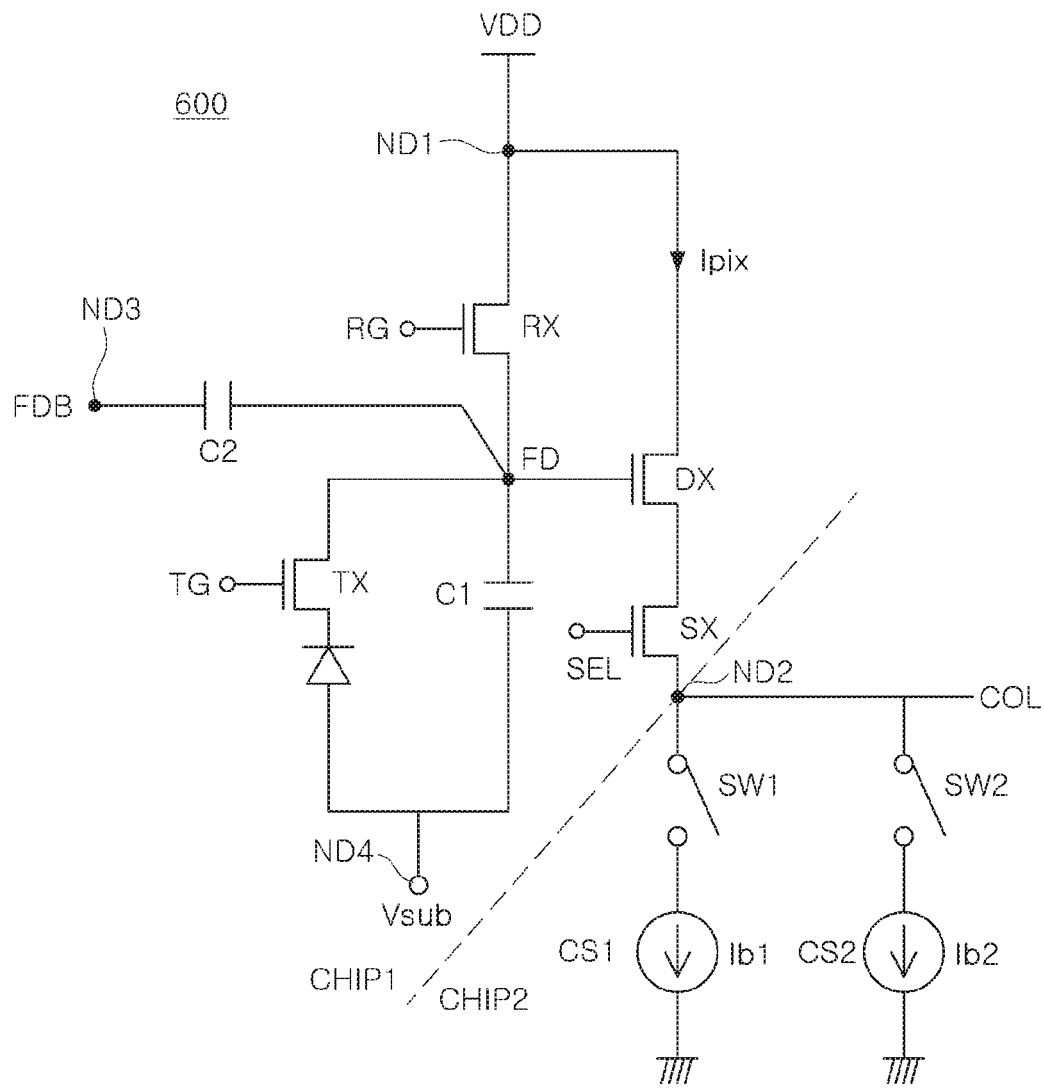
FIG. 18 is a view provided to illustrate an operation of an image sensor according to an exemplary embodiment of the present inventive concept.

FIG. 18 is a view provided to illustrate an operation of an image sensor according to an exemplary embodiment of the present inventive concept. Unlike the image sensor 500 of FIG. 15, in an image sensor 600 of FIG. 18, the second semiconductor chip CHIP2 may further include the second switch SW2 and the second current circuit CS2. The first switch SW1 may connect the first current circuit CS1 to the column line COL, and the second switch SW2 may connect the second current circuit CS2 to the column line COL.

The first current circuit CS1 may supply the first bias current Ib1 to the column line COL, and the second current circuit CS2 may supply the second bias current Ib2 to the column line COL. The first bias current Ib1 and the second bias current Ib2 may have different magnitudes from each other, but are not limited thereto.

The second switch SW2 may control the second current circuit CS2 such that the second bias current Ib2 is supplied to the column line COL only at a required time. For example, the second bias current Ib2 may be supplied to the column line COL at least a portion of a time when the first bias current Ib1 is supplied to the column line COL.

In a read-out operation of the image sensor 600, the second bias current Ib2 is supplied to the column line COL only at the required time, such that a settling time may be reduced without significantly increasing an amount of the current Ipix flowing through the driving transistor DX. Therefore, an operating speed of the image sensor 600 may be improved with low power.

Figure 19:
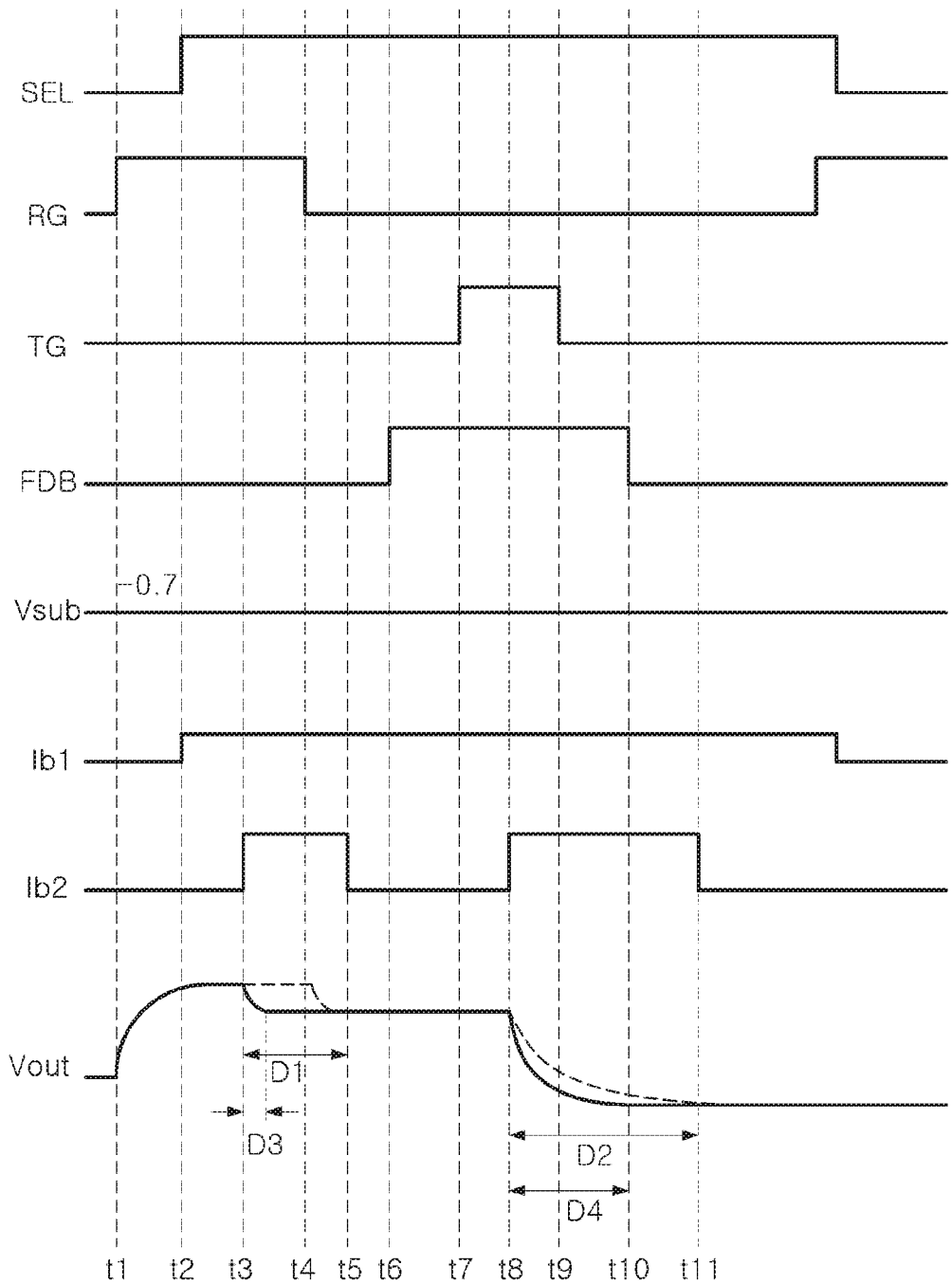
FIG. 19 is a timing diagram provided to illustrate an operation of an image sensor according to an exemplary embodiment of the present inventive concept.

FIG. 19 is a timing diagram provided to illustrate an operation of an image sensor according to an exemplary embodiment of the present inventive concept. Referring to FIGS. 18 and 19, the reset control signal RG may transition from a low level to a high level at t1. When the reset control signal RG transitions from a low level to a high level, the reset transistor RX may be turned on. When the reset transistor RX is turned on, the voltage of the floating diffusion FD may be reset to the power supply voltage VDD'.

Since the image sensor 600 is applied with the bias voltage Vsub, which is smaller than the ground voltage 0V (e.g., −0.7V), the power supply voltage VDD' applied to the image sensor 600 may be reduced while maintaining the potential Vim of the image sensor 600. Therefore, power consumption of the image sensor 600 may be reduced.

When the voltage of the floating diffusion FD is reset to the power supply voltage VDD', the selection control signal SEL may transition from a low level to a high level at t2. When the selection control signal SEL transitions from a low level to a high level, the selection transistor SX may be turned on. When the selection control signal SEL is turned on, the reset voltage may be output to the column line COL through the output node ND2.

The selection control signal SEL may maintain a high level in a period from t2 to t11. The selection transistor SX may be maintained in a turned on state while the selection control signal SEL is maintained at a high level. The first bias current Ib1 of the first current circuit CS1 may be provided to the column line COL while the selection transistor SX is maintained in a turned on state.

The second bias current Ib2 of the second current circuit CS2 may be provided to the column line COL from t3 to t5. The reset control signal RG may transition from a high level to a low level at t4 while the second bias current of Ib2 the second current circuit CS2 is provided to the output node ND2 from t3 to t5. When the reset control signal RG transitions from a high level to a low level, the reset transistor RX may be turned off.

When the reset transistor RX is turned off, a reset settling time for the reset voltage of the column line COL connected to the pixel to stabilize may be taken. The reset settling time D3 when providing the second bias current Ib2 to the column line COL may be shorter than the reset settling time D1 when not providing the second bias current Ib2 to the column line COL.

Therefore, when the reset control signal RG decreases from a high level to a low level while the second bias current Ib2 of the second current circuit CS2 is provided to the column line COL, the reset settling time can be shortened. After the reset voltage has stabilized, the reset voltage may be sampled during the reset sampling time.

The boosting control signal FDB may transition from a low level to a high level at t6. The boosting control signal FDB may maintain a high level for a period from t6 to t10. After the boosting control signal FDB transitions from a low level to a high level, the transmission control signal TG may transition from a low level to a high level at t7. The transfer transistor TX may be turned on when the transmission control signal TG transitions from a low level to a high level. When the transfer transistor TX is turned on, the charge generated when the photodiode PD is exposed to light may move to the floating diffusion FD.

The base potential level of the floating diffusion FD while the boosting control signal FDB is maintained at a high level may be maintained higher than the base potential level of the floating diffusion FD when the boosting control signal FDB is at a low level. In other words, the capacitance of the floating diffusion FD may be increased. Accordingly, even when the second power supply voltage VDD2, which is lower than the first power supply voltage VDD1, is applied, the potential Vim of the image sensor may be realized equally.

The second bias current Ib2 of the second current circuit CS2 may be provided to the column line COL from t8 to t11. The transmission control signal TG may transition from a high level to a low level at t9 while the second bias current Ib2 of the second current circuit CS2 is provided to the column line COL. When the transmission control signal TG transitions from a high level to a low level, the transfer transistor TX may be turned off. After the transfer transistor TX is turned off, the boosting control signal FDB may transition from a high level to a low level at t10.

When the transfer transistor TX is turned off, the pixel settling time to stabilize the pixel voltage of the column line COL connected to the pixel may be taken. The pixel settling time D4 when the second bias current Ib2 is provided to the column line COL may be shorter than the pixel settling time D2 when the second bias current Ib2 is not provided to the column line COL.

Therefore, when the transmission control signal TG decreases from a high level to a low level while the second bias current Ib2 of the second current circuit CS2 is provided to the column line COL, the pixel settling time may be shortened. After the pixel voltage is stabilized, the pixel voltage may be sampled during the pixel sampling time.

The image sensor 600 according to an exemplary embodiment of the present inventive concept may shorten the reset settling time and the pixel settling time by supplying the second bias current Ib2 only at a required time. Therefore, an overall read-out time may be shortened without significantly increasing an amount of the current Ipix flowing through the driving transistor DX.

Figure 20:
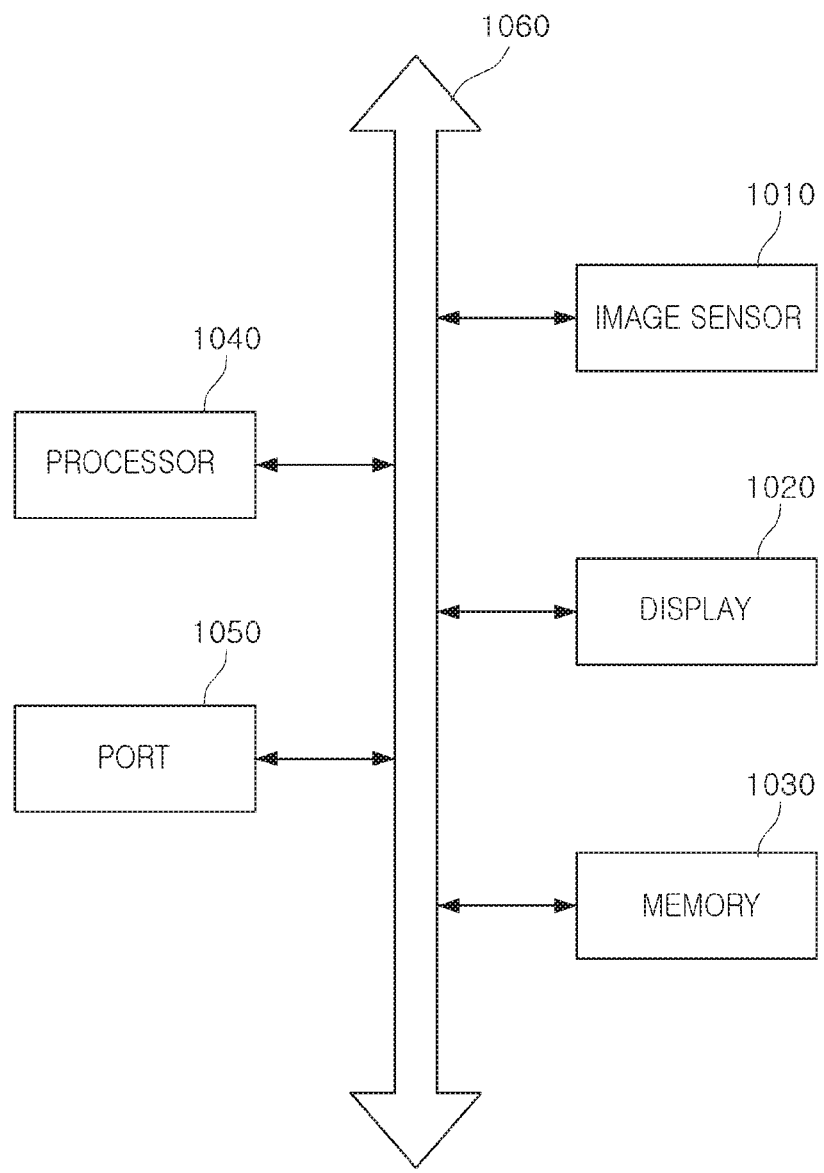
FIG. 20 is a block diagram schematically illustrating an electronic device including an image sensor according to an exemplary embodiment of the present inventive concept.

FIG. 20 is a block diagram schematically illustrating an electronic device including an image sensor according to an exemplary embodiment of the present inventive concept.

A computer device 1000 according to an exemplary embodiment of the present inventive concept may include an image sensor 1010, a display 1020, a memory 1030, a processor 1040, a port 1050, and the like. In addition, the computer device 1000 may further include a wired/wireless communication device, a power supply device, or the like. Among the components illustrated in FIG. 15, the port 1050 may be an element for communicating with a video card, a sound card, a memory card, an USB card, or the like. The computer device 1000 may be a smartphone, a tablet personal computer (PC), a smart wearable device, or the like, in addition to a general desktop computer or a laptop computer.

The processor 1040 may perform specific operations, commands, tasks, or the like. The processor 1040 may be a central processing unit (CPU), a microprocessor unit (MCU), a system on chip (SoC), or the like, and the processor 1040 may communicate with the image sensor 1010, the display 1020, and the memory 1030, as well as other devices connected to the port 1050, via a bus 1060.

The memory 1030 may be a storage medium storing data for the operation of the computer device 1000, multimedia data, or the like. The memory 1030 may include a volatile memory such as a random access memory (RAM), or a non-volatile memory such as a flash memory or the like. In addition, the memory 1030 may include at least one of a solid state drive (SSD) a hard disk drive (HDD), or an optical disk drive (ODD), as a storage device.

The image sensor 1010 may be mounted on a package substrate and connected to the processor 1040 by the bus 1060 or other communication means. The image sensor 1010 may be implemented in the computer device 1000 according to exemplary embodiments of the present inventive concept, as described with reference to FIGS. 1 to 19.

As set forth above, in an image sensor according to exemplary embodiments of the present inventive concept, a power voltage applied to a pixel may be reduced by using a boosting capacitor and a negative bias voltage. In addition, a second bias current may be output to column lines during at least a portion of time when a first bias current is input to the column lines connected to pixels in one horizontal period. The second bias current may shorten a settling time for stabilizing the voltage of the column lines, thus improving performance of the image sensor without significantly increasing an amount of current flowing in the pixels. Therefore, performance of the image sensor at low power can be improved.

While the present inventive concept has been shown and described above with reference to exemplary embodiments thereof, it will be apparent to those of ordinary skill in the art that modifications and variations in form and details could be made thereto without departing from the spirit and scope of the present inventive concept, as set forth by the appended claims.

What is claimed is:

1. An image sensor, comprising:
a row driver;
a photodiode connected to a first power node configured to supply a first source voltage, and configured to generate a charge in response to light;
a transfer transistor connecting the photodiode and a floating diffusion in response to a transmission control signal;
a reset transistor connected between the floating diffusion and a second power node configured to supply a second source voltage that is higher than the first source voltage;
a boosting capacitor connected directly to the floating diffusion and a control node where a boosting control signal is input, and configured to adjust a capacity of the floating diffusion in response to the boosting control signal; and
a bias circuit having a first current circuit and a second current circuit configured to supply different bias currents to an output node to which a voltage signal corresponding to a charge accumulated in the floating diffusion is output,
wherein the control node is different from the first power node,
wherein the first current circuit and the second current circuit are configured to simultaneously provide a first bias current and a second bias current to the output node during a first time, respectively,
wherein the row driver is configured to:

decrease the boosting control signal from a high level to a low level after turning off the transfer transistor; and switch the reset transistor from a turned on state to a turned off state during the first time, wherein the second current circuit is further configured to provide the second bias current to the output node during a second time, wherein the row driver is further configured to switch the transfer transistor from a turned on state to a turned off state during the second time, and wherein the second time is different from the first time.

2. The image sensor of claim 1, wherein the row driver is further configured to increase the boosting control signal from a low level to a high level before turning on the transfer transistor.

3. The image sensor of claim 1, wherein the row driver is further configured to increase the boosting control signal from a low level to a high level after turning off the transfer transistor.

4. The image sensor of claim 1, further comprising a selection transistor connected between the output node and the floating diffusion, wherein:
the selection transistor is configured to output the voltage signal corresponding to the charge accumulated in the floating diffusion to the output node; and
the first current circuit is further configured to provide the first bias current while the selection transistor is in a turned off state.

5. The image sensor of claim 1, wherein the row driver is further configured to increase the boosting control signal from a low level to a high level after turning off the reset transistor.

6. The image sensor of claim 5, wherein the row driver is further configured to turn on the reset transistor after decreasing the boosting control signal from a high level to a low level.

7. An image sensor, comprising:
a row driver;
a first semiconductor chip that includes:
a photodiode configured to generate a charge in response to light and connected to a floating diffusion and a first power node configured to supply a first source voltage to the photodiode,
a reset transistor connected between the floating diffusion and a second power node configured to supply a second source voltage,
a transfer transistor configured to transfer the charge generated by the photodiode to the floating diffusion,
a boosting capacitor connected directly to the floating diffusion and a control node where a boosting control signal is input, and configured to adjust a capacity of the floating diffusion in response to the boosting control signal, and
an output node configured to output a voltage signal corresponding to a charge accumulated in the floating diffusion; and
a second semiconductor chip connected to the output node through a metal pad and including a first current circuit and a second current circuit,
wherein the first current circuit and the second current circuit are configured to simultaneously provide a first bias current and a second bias current to the output node during a first time, respectively,
wherein the second source voltage is higher than the first source voltage, and
wherein the row driver is configured to:
decrease the boosting control signal from a high level to a low level after turning off the transfer transistor;
switch the reset transistor from a turned-on state to a turned-off state during the first time; and
switch the transfer transistor from a turned-on state to a turned-off state during a second time different from the first time.

8. The image sensor of claim 7, wherein the row driver is further configured to increase the boosting control signal from a low level to a high level before turning off the transfer transistor.

9. The image sensor of claim 7, wherein the row driver is further configured to increase the boosting control signal from a low level to a high level after turning on the transfer transistor.

10. The image sensor of claim 7, wherein the first semiconductor chip further comprises:
a source follower transistor configured to generate the voltage signal corresponding to the charge accumulated in the floating diffusion; and
a selection transistor configured to transfer the voltage signal to the output node in response to a selection control signal.

* * * * *